(12) United States Patent
Seo et al.

(10) Patent No.: US 11,889,757 B2
(45) Date of Patent: Jan. 30, 2024

(54) ORGANIC LIGHT EMITTING DIODE AND ORGANIC LIGHT EMITTING DEVICE HAVING THE SAME

(71) Applicant: LG Display Co., Ltd., Seoul (KR)

(72) Inventors: Bo-Min Seo, Paju-si (KR); Dae-Wi Yoon, Paju-si (KR); Jun-Yun Kim, Paju-si (KR); Chun-Ki Kim, Paju-si (KR); Mi-Sang Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 843 days.

(21) Appl. No.: 16/523,902

(22) Filed: Jul. 26, 2019

(65) Prior Publication Data

US 2020/0052226 A1  Feb. 13, 2020

(30) Foreign Application Priority Data

Aug. 7, 2018 (KR) .................. 10-2018-0091755

(51) Int. Cl.
*H10K 85/60* (2023.01)
*H10K 85/40* (2023.01)
(Continued)

(52) U.S. Cl.
CPC ......... *H10K 85/6572* (2023.02); *H10K 85/40* (2023.02); *H10K 85/654* (2023.02);
(Continued)

(58) Field of Classification Search
CPC ............... H01L 51/5036; H01L 51/504; H01L 51/5278; H01L 27/3209; H01L 51/0094;
(Continued)

(56) References Cited

U.S. PATENT DOCUMENTS 8,247,805 B2  8/2012 Yu et al.
9,954,186 B2  4/2018 Yang et al.
(Continued)

FOREIGN PATENT DOCUMENTS

CN    107887516 A    4/2018
CN    108117540 A    6/2018
(Continued)

OTHER PUBLICATIONS

Kim et al. "High Efficiency Phoshporescent Organic Light-Emitting Diodes Using Carbazole-Type Triplet Exciton Blocking Layer" Appl. Phys. Let. (90). (Year: 2007).*
(Continued)

*Primary Examiner* — Jenna N Chandhok
(74) *Attorney, Agent, or Firm* — Fenwick & West LLP

(57) ABSTRACT

An organic light emitting diode comprises an emitting material layer implementing a delayed fluorescence and another emitting material layer disposed adjacently to the emitting material layer and implementing fluorescence or phosphorescence and an organic light emitting device including the diode. As exciton generated in the plural emitting material layer drops to a ground state through the luminous materials each of which has a controlled energy level, it is possible to implement excellent luminous efficiency derived from a delayed fluorescent material and improved color purity derived from a fluorescent or phosphorescent material having narrow FWHM.

27 Claims, 12 Drawing Sheets

(51) Int. Cl.
*H10K 50/11* (2023.01)
*H10K 50/13* (2023.01)
*H10K 50/18* (2023.01)
*H10K 50/81* (2023.01)
*H10K 50/82* (2023.01)
*H10K 101/10* (2023.01)
*H10K 101/00* (2023.01)

(52) U.S. Cl.
CPC ......... *H10K 85/6574* (2023.02); *H10K 50/11* (2023.02); *H10K 50/13* (2023.02); *H10K 50/18* (2023.02); *H10K 50/81* (2023.02); *H10K 50/82* (2023.02); *H10K 2101/10* (2023.02); *H10K 2101/27* (2023.02)

(58) Field of Classification Search
CPC ............. H01L 51/0073; H01L 51/0072; H01L 51/0067; H10K 85/6572; H10K 85/40; H10K 85/654; H10K 85/6574; H10K 2101/20; H10K 50/121
See application file for complete search history.

(56) References Cited

U.S. PATENT DOCUMENTS

| | | | |
|---|---|---|---|
| 10,135,005 | B2 | 11/2018 | Yang et al. |
| 10,193,085 | B2 | 1/2019 | Yang et al. |
| 10,411,211 | B2 | 9/2019 | Tsukamoto et al. |
| 10,566,561 | B2 | 2/2020 | Kim et al. |
| 10,651,399 | B2 | 5/2020 | Yang et al. |
| 10,658,607 | B2 | 5/2020 | Tsukamoto et al. |
| 10,770,662 | B2 | 9/2020 | Yoon et al. |
| 2003/0170491 | A1* | 9/2003 | Liao ........................ H05B 45/60 257/88 |
| 2007/0099026 | A1* | 5/2007 | Lee ........................ H01L 51/504 428/917 |
| 2008/0197770 | A1* | 8/2008 | Choi ................... H01L 27/3276 313/504 |
| 2010/0155706 | A1 | 6/2010 | Yu et al. |
| 2012/0280221 | A1 | 11/2012 | Yu et al. |
| 2016/0093823 | A1 | 3/2016 | Seo et al. |
| 2016/0133856 | A1 | 5/2016 | Yang et al. |
| 2016/0190478 | A1* | 6/2016 | Nakanotani ......... H01L 51/0071 257/40 |
| 2017/0320855 | A1* | 11/2017 | Wong ................. C07D 253/065 |
| 2018/0090705 | A1 | 3/2018 | Kim et al. |
| 2018/0151811 | A1 | 5/2018 | Yoon et al. |
| 2018/0186819 | A1 | 7/2018 | Kim et al. |
| 2018/0205019 | A1 | 7/2018 | Fuchiwaki et al. |
| 2018/0205023 | A1 | 7/2018 | Yang et al. |
| 2018/0269408 | A1 | 9/2018 | Yang et al. |
| 2018/0323396 | A1 | 11/2018 | Tsukamoto et al. |
| 2019/0036035 | A1 | 1/2019 | Yang et al. |
| 2019/0173037 | A1 | 6/2019 | Seo et al. |
| 2019/0326540 | A1 | 10/2019 | Tsukamoto et al. |

FOREIGN PATENT DOCUMENTS

| | | |
|---|---|---|
| JP | 2006-069964 A | 3/2006 |
| JP | 2010-523648 A | 7/2010 |
| JP | 2016-072632 A | 5/2016 |
| JP | 2016-094418 A | 5/2016 |
| JP | 2016-119355 A | 6/2016 |
| KR | 10-2016-0073914 A | 6/2016 |
| KR | 10-2018-0035528 A | 4/2018 |
| KR | 10-2018-0062196 A | 6/2018 |
| KR | 10-2019-0012679 A | 2/2019 |
| WO | WO 2016/027760 A1 | 2/2016 |
| WO | WO 2017/082169 A1 | 8/2018 |

OTHER PUBLICATIONS

Ossila. TSPO1 Product Information. Retrieved from https://www.ossila.com/products/tspo1 (Year: 2022).*
Zhang et al. "Synthesis and Optical Properties of Novel Carbazole DerivativesContaining Pyridine Ring" J. Heterocyclic Chem (51) 2014, pp. 669-673. (Year: 2014).*
Japan Patent Office, Notice of Reasons for Refusal, JP Patent Application No. 2019-145128, dated Aug. 18, 2020, seven pages.
China National Intellectual Property Administration, Office Action, CN Patent Application No. 201910700510.2, dated Sep. 27, 2021, 32 pages.
Park, S. Y. et al., "Unconventional Three-armed Luminogens Exhibiting Both Aggregation-Induced Emission and Thermally Activated Delayed Fluorescence Resulting in High-Performing Solution-Processed OLEDs," ACS Applied Materials & Interfaces, Apr. 9, 2018, pp. 1-40.
Sun, J.W. et al., "Thermally Activated Delayed Fluorescence from Azasiline Based Intramolecular Charge-Transfer Emitter (DTPDDA) and a Highly Efficient Blue Light Emitting Diode," ACS Chemistry of Materials, Sep. 14, 2015, pp. 6675-6681.
Wu, T. et al., "Diboron compound-based organic light-emitting diodes with high efficiency and reduced efficiency roll-off," Nature Photonics, vol. 12, Mar. 5, 2018, pp. 235-240.
Korean Intellectual Property Administration, Office Action, KR Patent Application No. 10-2018-0091755, dated Mar. 20, 2023, 18 pages.

* cited by examiner

ORGANIC LIGHT EMITTING DIODE AND ORGANIC LIGHT EMITTING DEVICE HAVING THE SAME

CROSS-REFERENCE TO RELATED APPLICATIONS

This application claims the benefit under 35 U.S.C. § 119(a) of Republic of Korea Patent Application No. 10-2018-0091755, filed in Korea on Aug. 7, 2018, which is incorporated herein by reference in its entirety.

BACKGROUND

Technical Field

The present disclosure relates to an organic light emitting diode, and more specifically, to an organic light emitting diode enhancing luminous efficiency and color purity and organic light emitting device having the same.

Description of the Related Art

As a display device has become larger, there exists a need for a flat display device with lower spacing occupation. Among the flat display devices, a display device using an organic light emitting diode (OLED) has come into the spotlight.

The OLED can be formed as a thin film less than 2000 Å and implement unidirectional or bidirectional image as electrode configurations. The OLED can be formed even on a flexible transparent substrate such as a plastic substrate so as to realize a flexible or foldable light emitting device. In addition, the OLED can be driven at a lower voltage of 10 V or less. Moreover, the OLED has relatively lower power consumption for driving compared to plasma display panel and inorganic electroluminescent devices, and color purity thereof is very high. As a result, the OLED display device has attracted a lot of attention as a next-generation display device that can replace a liquid crystal display device (LCD).

The OLED comprises a hole injection electrode (anode), an electron injection electrode (cathode) and an emission unit disposed between the anode and the cathode. The emitting unit may comprise a hole injection layer (HIL), a hole transport layer (HTL), an emitting material layer (EML), an electron transport layer (ETL) and an electron injection layer (EIL), each of which is laminated sequentially over the anode, in order to increase its luminous efficiency.

In the OLED, holes injected from the anode and electrons injected from the cathode are combined in the EML to form excitons at an unstable energy state, and then emit light as the exciton drops to the stable ground state. If necessary, the OLED may further comprise an exciton blocking layer such as an electron blocking layer (EBL) between the HTL and the EML and/or a hole blocking layer (HBL) between the EML and the ETL in order to prevent the exciton from being quenched.

The EML generally includes a host and a dopant where a substantial light emission is occurred. Since a blue luminous material should have wider energy bandgap than other color luminous materials, there is a limit to develop the blue luminous material.

BRIEF SUMMARY

Accordingly, the present disclosure is directed to an organic light emitting diode and an organic light emitting device having the same that substantially obviates one or more of the problems due to the limitations and disadvantages of the related art.

An object of the present disclosure is to provide an organic light emitting diode that improves its luminous efficiency and color purity, and an organic light emitting device having the same.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an aspect, the present disclosure provides an organic light emitting diode that comprises first and second electrodes facing each other; and at least one emitting unit disposed between the first and second electrodes and including an emitting material layer, wherein the emitting material layer includes a first emitting material layer including a first compound and a second compound and a second emitting material layer including a third compound and fourth compound and disposed between the first electrode and the first emitting material layer or between the first emitting material layer and the second electrode, wherein the first compound includes an organic compound having the following structure of Chemical Formula 1 and the second compound includes an organic compound having the following structure of Chemical Formula 3:

Chemical Formula 1

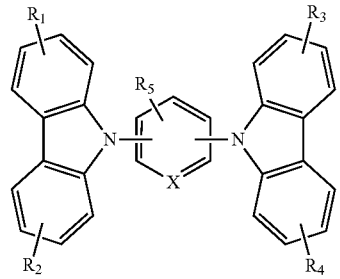

wherein each of $R_1$ to $R_5$ is independently selected from the group consisting of protium, deuterium, tritium, $C_5$~$C_{30}$ aryl group and $C_4$~$C_{30}$ hetero aryl group; and X is $CR_6$ or nitrogen (N), wherein $R_6$ is protium, deuterium, tritium or $C_1$~$C_{20}$ alkyl group.

Chemical Formula 3

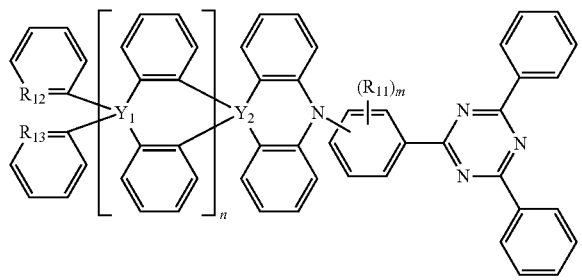

wherein $R_{11}$ is selected from the group consisting of protium, deuterium, tritium, $C_5$~$C_{30}$ aryl group and $C_4$~$C_{30}$ hetero aryl group; each of $R_{12}$ and $R_{13}$ is a carbon (C), wherein each of $R_{12}$ and $R_{13}$ is bonded to protium, deuterium or tritium or $R_{12}$ is bonded to $R_{13}$ directly or through oxygen (O), sulfur (S) or selenium (Se); each of $Y_1$ and $Y_2$ is independently carbon (C), silicon (Si) or germanium (Ge); m is an integer of 1 to 4; and n is an integer of 0 to 2.

According to another aspect, the present disclosure provides an organic light emitting device having the above organic light emitting diode.

It is to be understood that both the foregoing general description and the following detailed description are examples and are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
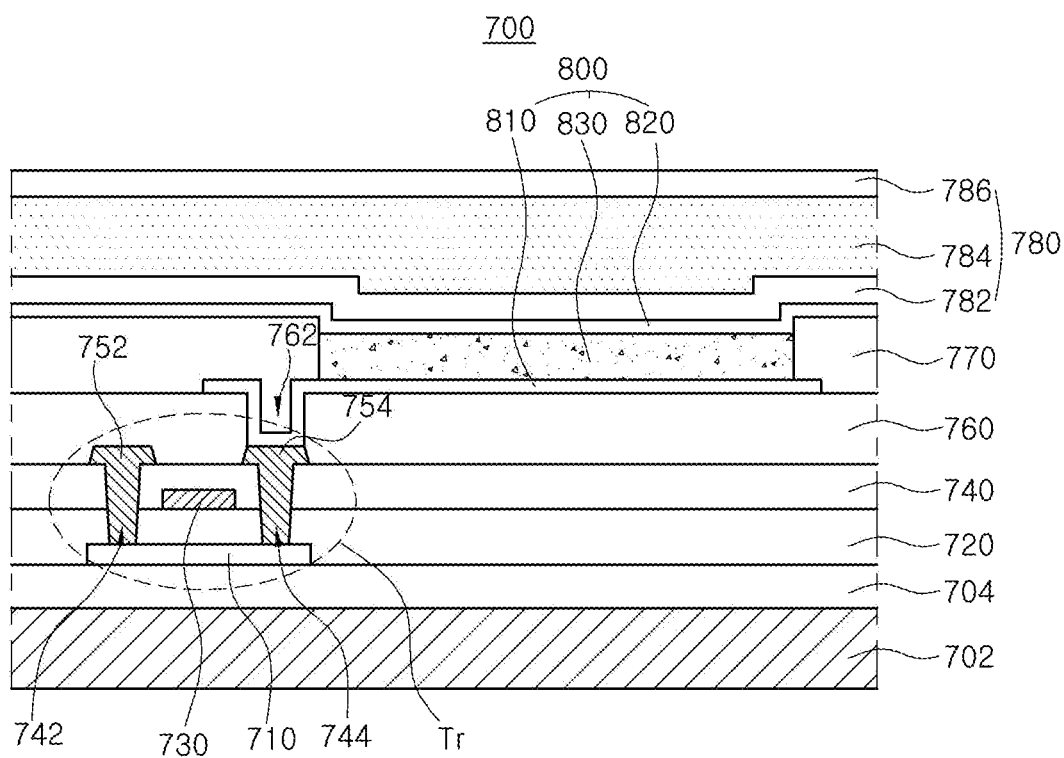
FIG. 1 is a schematic cross-sectional view illustrating an organic light emitting illumination device according to an embodiment of the present disclosure.

Reference will now be made in detail to aspects of the disclosure, examples of which are illustrated in the accompanying drawings.

Organic Light Emitting Device

An organic light emitting diode (OLED) emits light as holes and electrons injected are combined to form excitons in an emitting material layer (EML) and then unstable excited state excitons return to a stable ground state. The external quantum efficiency (EQE; $\eta_{ext}$) of the luminous material applied into the EML can be calculated by the following Equation (1):

$$\eta_{ext} = \eta_{S/T} \times \Gamma \times \Phi \times \eta_{out\text{-}coupling} \tag{1}$$

In Equation (1), "$\eta_{S/T}$" is exciton generation efficiency (singlet/triplet ratio); "r" is a charge balance factor; "$\Phi$" is radiative quantum efficiency; "$\eta_{out\text{-}coupling}$" is out-coupling efficiency.

"$\eta_{S/T}$" is a transformation ratio from exciton to light and has maximum value of 0.25 in case of fluorescent materials. Theoretically, when electrons meet holes to form excitons, singlet exciton of a paired spin and triplet exciton of an unpaired spin are produced by a ratio of 1:3 by spin arrangements. Only the singlet exciton among the excitons can only be involved in emission process in case of the fluorescent materials.

Charge balance factor "r" is a balance between holes and electrons both of which form excitons and generally has a value of "1" assuming 1:1 matching of 100%. "$\Phi$" is a value related with luminous efficiency of actual luminous materials and depends upon photoluminescence of dopant in a host-dopant system.

"$\eta_{out\text{-}coupling}$" is a ratio of light extracted outwardly among the emitted light in a luminous materials. When isotropic luminous material is thermally deposited to form a thin film, each of luminous molecules does not have specific orientation, but exists with random states. The out-coupling efficiency in such random orientation is generally assumed "0.2".

Accordingly, when combining 4 parameters of Equation (1) above, the OLED may exhibit 5% luminous efficiency by maximum in case of using the prior art fluorescent material. Phosphorescent material has been developed to solve the low luminous efficiency of the fluorescent materials. The phosphorescent materials use different luminous mechanism of converting both singlet excitons and triplet exciton into light.

However, the representative phosphorescent materials, metal complexes are very expensive and have too short luminous lifetime to be commercially applicable. Particularly, the prior art blue phosphorescent materials do not have enough color purity for the display device and exhibit very short luminous lifetime, and therefore, they have not been used in commercial display devices. In addition, blue host should have energy levels higher than energy levels of the blue phosphorescent dopant in order to prevent triplet exciton energy of the blue phosphorescent dopant from being transferred to the blue host. The organic compounds, which can be utilized as the blue phosphorescent hosts, are much limited since organic aromatic compounds tend to have reduced triplet energy levels as conjugation structure of the compound are increased or aromatic rings are fused.

Moreover, the phosphorescent host having higher triplet energy level showed poor charge injections and charge transportations, and thereby causing an OLED to raise its driving voltage and power consumptions. High driving voltage applies electrical stresses to the materials in the EML, which results in modifications of the host and dopant, and thereby having bad effects on the luminous lifetime of the OLED. As such, the blue phosphorescent hosts have not satisfied the luminous efficiency and reliability required by a display industry.

A delayed fluorescent material have been developed to solve the disadvantages accompanied by the prior art fluorescent or phosphorescent dopants. Representative delayed fluorescent materials use a thermally activated delayed fluorescence (TADF). The delayed fluorescent material enables intramolecular charge transfer so that it can use triplet exciton energy as well as singlet exciton energy in the luminescence process. Since the delayed fluorescent material uses the singlet and triplet exciton energies as the phosphorescent materials, its luminous efficiency is excellent.

However, the delayed fluorescent material shows low luminous lifetime because it uses triplet exciton energy during the luminescence process. In addition, the delayed fluorescent materials use charge transfer (CT) luminous mechanism. As a result, since the delayed fluorescent materials have luminescence wavelength with wide FWHM (full-with at half maximum) owing to the CT luminous mechanism so that the delayed fluorescent materials have a limitation to be applied to a display device in terms of color purity.

Accordingly, there is a need for development of an organic light emitting diode having high reliability, excellent luminous efficiency, and improved color purity. The organic light emitting diode of the present disclosure can maximize luminous efficiency and color purity by constituting a multiple-layered emitting material layer in an emitting unit. The OLED of the present disclosure may be applied to an organic light emitting device such as an organic light emitting display device and an organic light emitting illumination device. An organic light emitting display device having the OLED will be explained. FIG. 1 is a cross-sectional view illustrating an organic light emitting display device of the present disclosure.

As illustrated in FIG. 1, the organic light emitting display device 700 comprises a substrate 702, a thin-film transistor Tr on the substrate 702, and an organic light emitting diode 800 connected to the thin film transistor Tr.

The substrate 702 may include, but are not limited to, glass, thin flexible material and/or polymer plastics. For example, the flexible material may be selected from the group, but are not limited to, polyimide (PI), polyethersulfone (PES), polyethylenenaphthalate (PEN), polyethylene terephthalate (PET), polycarbonate (PC) and combination thereof. The substrate 702, over which the thin film transistor Tr and the organic light emitting diode 800 are arranged, form an array substrate.

A buffer layer 704 may be disposed over the substrate 702, and the thin film transistor Tr is disposed over the buffer layer 704. The buffer layer 704 may be omitted.

A semiconductor layer 710 is disposed over the buffer layer 704. In one exemplary embodiment, the semiconductor layer 710 may comprise oxide semiconductor materials. In this case, a light-shield pattern (not shown) may be disposed under the semiconductor layer 710, and the light-shield pattern (not shown) can prevent light from being incident toward the semiconductor layer 710, and thereby, preventing the semiconductor layer 710 from being deteriorated by the light. Alternatively, the semiconductor layer 710 may comprise, but are not limited to, polycrystalline silicon. In this case, opposite edges of the semiconductor layer 710 may be doped with impurities.

A gate insulating layer 720 formed of an insulating material is disposed on the semiconductor layer 710. The gate insulating layer 720 may include an inorganic insulating material such as silicon oxide ($SiO_x$) or silicon nitride ($SiN_x$).

A gate electrode 730 made of a conductive material such as a metal is disposed over the gate insulating layer 720 so as to correspond to a center of the semiconductor layer 710. While the gate insulating layer 720 is disposed over a whole area of the substrate 702 in FIG. 1, the gate insulating layer 720 may be patterned identically as the gate electrode 730.

An interlayer insulating layer 740 formed of an insulating material is disposed on the gate electrode 730 with covering over an entire surface of the substrate 702. The interlayer insulating layer 740 may includes an inorganic insulating material such as silicon oxide ($SiO_x$) or silicon nitride ($SiN_x$), or an organic insulating material such as benzocyclobutene or photo-acryl.

The interlayer insulating layer 740 has first and second semiconductor layer contact holes 742 and 744 that expose both sides of the semiconductor layer 710. The first and second semiconductor layer contact holes 742 and 744 are disposed over opposite sides of the gate electrode 730 with spacing apart from the gate electrode 730. The first and second semiconductor layer contact holes 742 and 744 are formed within the gate insulating layer 720 in FIG. 1. Alternatively, the first and second semiconductor layer contact holes 742 and 744 are formed only within the interlayer insulating layer 740 when the gate insulating layer 720 is patterned identically as the gate electrode 730.

A source electrode 752 and a drain electrode 754, which are formed of a conductive material such as a metal, are disposed on the interlayer insulating layer 740. The source electrode 752 and the drain electrode 754 are spaced apart from each other with respect to the gate electrode 730 and contact both sides of the semiconductor layer 710 through the first and second semiconductor layer contact holes 742 and 744, respectively.

The semiconductor layer 710, the gate electrode 730, the source electrode 752, and the drain electrode 754 constitute the thin film transistor Tr, which acts as a driving element. The thin film transistor Tr in FIG. 1 has a coplanar structure in which the gate electrode 730, the source electrode 752, and the drain electrode 754 are disposed over the semiconductor layer 710. Alternatively, the thin film transistor Tr may have an inverted staggered structure in which a gate electrode is disposed under a semiconductor layer and source and drain electrodes are disposed over the semiconductor layer. In this case, the semiconductor layer may comprise amorphous silicon.

Although not shown in FIG. 1, a gate line and a data line, which cross each other to define a pixel region, and a switching element, which is connected to the gate line and the data line, may be further formed in the pixel region. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 700 may include a color filter (not shown) for absorbing a part of the light emitted from the organic light emitting diode 800. For example, the color filter (not shown) may absorb a light of specific wavelength such as red (R), green (G), or blue (B) color. In this case, the organic light-emitting display device 700 can implement full-color through the color filter (not shown).

For example, when the organic light emitting display device 700 is a bottom-emission type, the color filter (not shown) may be disposed on the interlayer insulating layer 740 with corresponding to the organic light emitting diode 800. Alternatively, when the organic light emitting display device 700 is a top-emission type, the color filter (not shown) may be disposed over the organic light emitting diode 800, that is, a second electrode 820.

A passivation layer 760 is disposed on the source and drain electrodes 752 and 754 over the whole substrate 702. The passivation layer 760 has a flat top surface and a drain contact hole 762 that exposes the drain electrode 754 of the thin film transistor Tr. While the drain contact hole 762 is disposed on the second semiconductor layer contact hole 744 in FIG. 1, it may be spaced apart from the second semiconductor layer contact hole 744.

The organic light emitting diode 800 includes a first electrode 810 that is disposed on the passivation layer 760 and connected to the drain electrode 754 of the thin film transistor Tr. The organic light emitting diode 800 further includes an emitting unit 830 and a second electrode 820 each of which is disposed sequentially on the first electrode 810.

The first electrode 810 is disposed in each pixel region. The first electrode 810 may be an anode and include a conductive material having a relatively high work function value. For example, the first electrode 810 may include, but are not limited to, a transparent conductive material such as indium tin oxide (ITO), indium zinc oxide (IZO), indium tin zinc oxide (ITZO), SnO, ZnO, indium cerium oxide (ICO), aluminum doped zinc oxide (AZO), and the likes.

In one exemplary embodiment, when the organic light emitting display device 700 is a top-emission type, a reflective electrode or a reflective layer (not shown) may be disposed under the first electrode 810. For example, the reflective electrode or the reflective layer (not shown) may include, but are not limited to, aluminum-palladium-copper (APC) alloy.

In addition, a bank layer 770 is disposed on the passivation layer 760 in order to cover edges of the first electrode 810. The bank layer 770 exposes a center of the first electrode 810.

An emitting unit 830 as an emission layer is disposed on the first electrode 810. In one exemplary embodiment, the emitting unit 830 may have a mono-layered structure of an emitting material layer. Alternatively, the emitting unit 830 may have a multiple-layered structure of a hole injection layer (HIL), a hole transport layer (HTL), an electron blocking layer (EBL), an emitting material layer (EML), a hole blocking layer (HBL), an electron transport layer (ETL) and/or an electron injection layer (EIL) (See, FIGS. 2, 5, 7, 8 and 9). The emitting unit 830 may have multiple EMLs.

As an example, the EML may include a first EML including a first compound and a second compound and a second EML disposed adjacently to the first EML and including a third compound and a fourth compound. Alternatively, the EML may include a first EML including a first compound and a second compound and a second EML disposed adjacently to the first EML and including a third compound, a fourth compound, and a fifth compound.

In another alternative embodiment, the EML may include a first EML including a first compound and a second compound, a second EML disposed adjacently to the first EML and including a third compound and a fourth compound, and a third EML disposed adjacently to the first EML and including a sixth compound, a seventh compound, and an eighth compound. Concrete kinds of the first to eighth compounds, energy level relationships among those compounds and a structure of the EML will be explained in more detail below.

The second electrode 820 is disposed over the substrate 702 above which the emitting unit 830 is disposed. The second electrode 820 may be disposed over a whole display area and may include a conductive material having a relatively low work function value compared to the first electrode 810. The second electrode 820 may be a cathode. For example, the second electrode 820 may include, but are not limited to, aluminum (Al), magnesium (Mg), calcium (Ca), silver (Ag), alloy thereof or combination thereof such as aluminum-magnesium alloy (Al—Mg).

In addition, an encapsulation film 780 may be disposed over the second electrode 820 in order to prevent outer moisture from penetrating into the organic light emitting diode 800. The encapsulation film 780 may have, but are not limited to, a laminated structure of a first inorganic insulating film 782, an organic insulating film 784, and a second inorganic insulating film 786.

The emitting unit 830 of the organic light emitting diode 800 has multiple emitting material layers including hosts, at least one delayed fluorescent dopant and at least one fluorescent or phosphorescent dopant. It is possible to fabricate the organic light emitting diode 800 and the organic light emitting device 700 each of which can implement hyperfluorescence having maximum luminous efficiency and improving color purity by applying those luminous materials.

Organic Light Emitting Diode (OLED)

Figure 2:
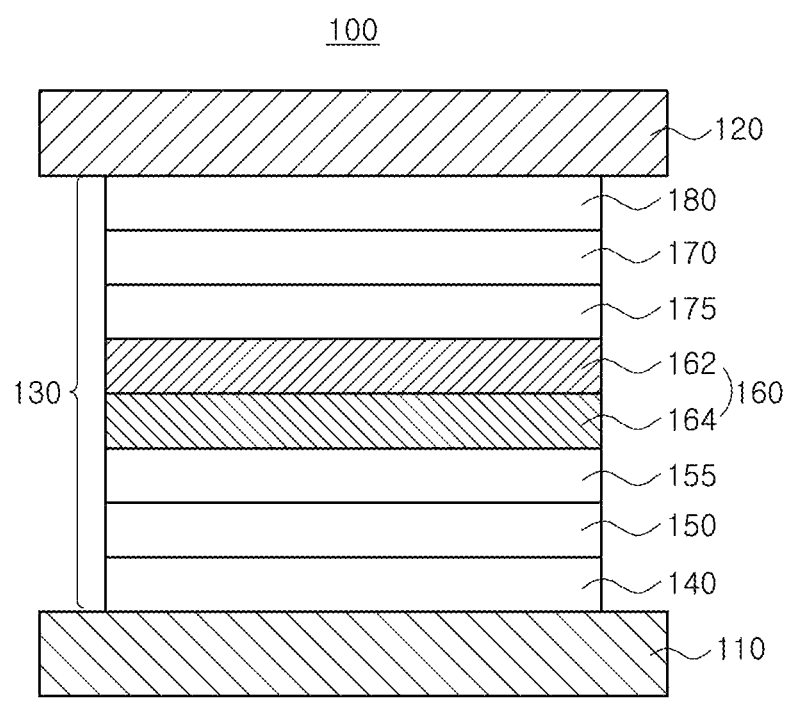
FIG. 2 is a schematic cross-sectional view illustrating an organic light emitting diode in accordance with an exemplary embodiment of the present disclosure.

FIG. 2 is a schematic cross-sectional view illustrating an organic light emitting diode in accordance with an exemplary embodiment of the present disclosure. As illustrated in FIG. 2, the organic light emitting diode (OLED) 100 in accordance with an exemplary first embodiment of the present disclosure includes first and second electrodes 110 and 120 facing each other and an emitting unit 130, as an emission layer, disposed between the first and second electrodes 110 and 120. In one exemplary embodiment, the emitting unit 130 includes a hole injection layer (HIL) 140, a hole transport layer (HTL) 150, an emitting material layer (EML) 160, an electron transport layer (ETL) 170 and an electron injection layer (EIL) 180 each of which is laminated sequentially from the first electrode 110. Alternatively, the emitting unit 130 may further include a first exciton blocking layer, i.e. an electron blocking layer (EBL) 155 disposed between the HTL 150 and the EML 160 and/or a second exciton blocking layer, i.e., a hole blocking layer (HBL) 175 disposed between the EML 160 and the ETL 170.

The first electrode 110 may be an anode that provides a hole into the EML 160. The first electrode 110 may include a conductive material having a relatively high work function value, for example, a transparent conductive oxide (TCO). In an exemplary embodiment, the first electrode 110 may include, but are not limited to, indium tin oxide (ITO), indium zinc oxide (IZO), indium tin zinc oxide (ITZO), SnO, ZnO, indium cerium oxide (ICO), aluminum doped zinc oxide (AZO), and the like.

The second electrode 120 may be a cathode that provides an electron into the EML 160. The second electrode 120 may include a conductive material having a relatively low work function values, i.e., a highly reflective material such as aluminum (Al), magnesium (Mg), calcium (Ca), silver (Ag), alloy thereof or combination thereof such as aluminum-magnesium alloy (Al—Mg).

The HIL 140 is disposed between the first electrode 110 and the HTL 150 and improves an interface property between the inorganic first electrode 110 and the organic HTL 150. In one exemplary embodiment, the HIL 140 may include, but are not limited to, 4,4' 4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2' 3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 140 may be omitted in compliance with a structure of the OLED 100.

The HTL 150 is disposed adjacently to the EML 160 between the first electrode 110 and the EML 160. In one exemplary embodiment, the HTL 150 may include, but are not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl]cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

In one exemplary embodiment, each of the HIL 140 and the HTL 150 may be laminated with a thickness of, but are not limited to, about 5 nm to about 200 nm, preferably about 5 nm to about 100 nm.

The EML 160 includes a first EML (EML1) 162 and a second EML (EML2) 164. The configurations and luminous mechanism among those EMLs 162 and 164 will be explained in more detail below.

The ETL 170 and the EIL 180 are laminated sequentially between the EML 160 and the second electrode 120. The ETL 170 includes a material having high electron mobility so as to provide electrons stably into the EML 160 by fast electron transportation.

In one exemplary embodiment, the ETL 170 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes.

For example, the ETL 170 may include, but are not limited to, tris-(8-hydroxyquinoline aluminum) ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluo-rene)] (PFNBr), tris(phenylquinoxaline) (TPQ) and/or 2-[4-(9,10-di-2-naphthalenyl-2-anthracenyl)phenyl]-1-phenyl-1H-benzimidazole.

The EIL 180 is disposed between the second electrode 120 and the ETL 170, and can improve physical properties of the second electrode 120 and therefore, can enhance the life span of the OLED 100. In one exemplary embodiment, the EIL 180 may include, but are not limited to, an alkali halide such as LiF, CsF, NaF, $BaF_2$ and the likes, and/or an organic metal compound such as lithium benzoate, sodium stearate, and the likes.

In one embodiment, each of the ETL 170 and the EIL 180 may be laminated with a thickness of, but are not limited to, about 10 nm to about 200 nm, and preferably about 10 nm to about 100 nm.

When holes are transferred to the second electrode 120 via the EML 160 and/or electrons are transferred to the first electrode 110 via the EML 160, the OLED 100 may have short lifetime and reduced luminous efficiency. In order to prevent these phenomena, the OLED 100 in accordance with this embodiment of the present disclosure has at least one exciton blocking layer adjacent to the EML 160.

For example, the OLED 100 of the exemplary embodiment includes the EBL 155 between the HTL 150 and the EML 160 so as to control and prevent electron transfers. In one exemplary embodiment, the EBL 155 may include, but are not limited to, TCTA, Tris[4-(diethylamino)phenyl] amine, N-(biphenyl-4-yl)-9,9-dimethyl-N-(4-(9-phenyl-9H-carbazol-3-yl)phenyl)-9H-fluorene-2-amine, TAPC, MTDATA, 1,3-Bis(carbazol-9-yl)benzene (mCP), 3,3'-Bis (N-carbazolyl)-1,1'-biphenyl (mCBP), CuPc, N,N'-bis[4-(bis(3-methylphenyl)amino)phenyl]-N,N'-diphenyl-[1,1'-biphenyl]-4,4'-diamine (DNTPD) and/or TDAPB.

In addition, the OLED 100 further includes the HBL 175 as a second exciton blocking layer between the EML 160 and the ETL 170 so that holes cannot be transferred from the EML 160 to the ETL 170. In one exemplary embodiment, the HBL 175 may include, but are not limited to, oxadiazole-based compounds, triazole-based compounds, phenanthroline-based compounds, benzoxazole-based compounds, benzothiazole-based compounds, benzimidazole-based compounds, and triazine-based compounds.

For example, the HBL 175 may include a compound having a relatively low HOMO energy level compared to the emitting material in EML 160. The HBL 175 may include, but are not limited to, BCP, BAlq, $Alq_3$, PBD, spiro-PBD, Liq, Bis-4,5-(3,5-di-3-pyridylphenyl)-2-methylpyrimidine (B3PYMPM), Oxybis(2,1-phenylene)bis(diphenylphosphine oxide) (DPEPO) and combination thereof.

As an example, each of the EBL 155 and the HBL 175 may be laminated with a thickness of, but are not limited to, about 5 nm to about 200 nm, preferably about 10 nm to about 100 nm.

As described above, the EML 160 of the OLED 100 in accordance with the first embodiment of the present disclosure includes the two EMLs 162 and 164. Particularly, the EML 160 includes the EML1 162 including a first compound and second compound and the EML2 164 including a third compound and a fourth compound. As an example, the first compound may be a first host and the second compound may be a delayed fluorescent dopant (T dopant). The third compound may be a second host and the fourth compound may be a fluorescent or phosphorescent dopant (F dopant).

The EML1 162 may be disposed between the EBL 155 and the HBL 175, and the EML2 164 may be disposed between the EBL 155 and the EML1 162 or between the EML1 162 and the HBL 175. Hereinafter, the EML 160, where the EML2 164 is disposed between the EBL 155 and the EML1 162, will be explained.

Figure 3:
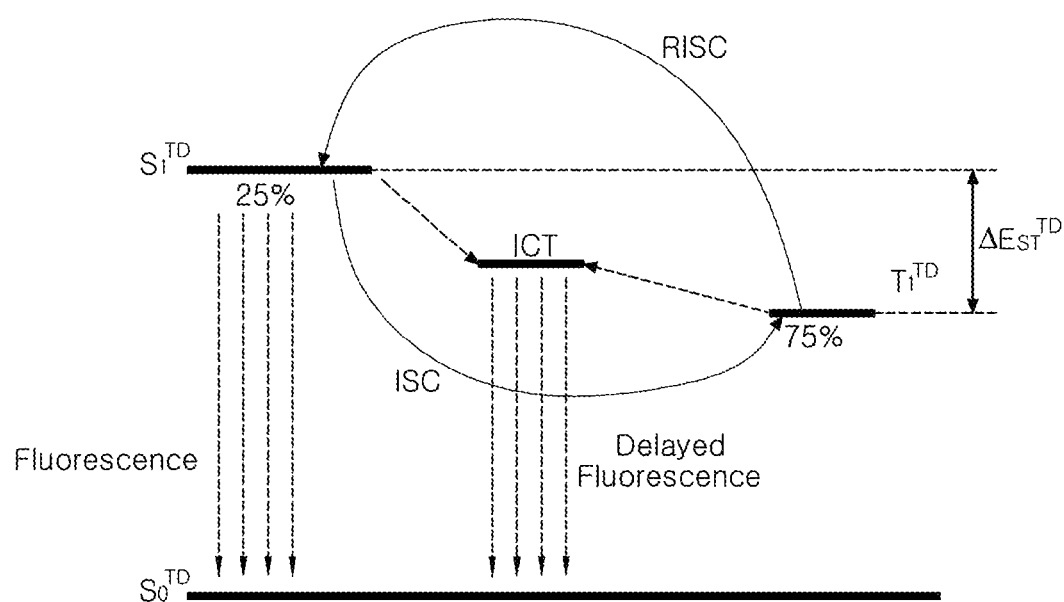
FIG. 3 is a schematic diagram illustrating luminous mechanism by a delayed fluorescent material in an EML in accordance with an exemplary embodiment of the present disclosure.

The EML1 162 includes the second compound, which may be the delayed fluorescent material. In this case, the OLED 100 having improved luminous efficiency and excellent color purity can be implemented by adjusting energy levels among the first compound as the host and the second compound. FIG. 3 is a schematic diagram illustrating luminous mechanism by a delayed fluorescent material in an EML in accordance with an exemplary embodiment of the present disclosure.

The representative delayed fluorescence is a thermally activated delayed fluorescence (TADF). Triplet exciton in the delayed fluorescent material can be activated by heat or electrical field so that super-fluorescence beyond the maximal luminous efficiency by conventional fluorescent material can be implemented.

Since the triplet excitons within the delayed fluorescent material can be activated by heat or electrical field generated in driving an OLED, the triplet excitons can be involved in luminescence processes. Since the delayed fluorescent material generally has an electron donor moiety as well as an electron acceptor moiety, it can be converted to an intramolecular charge transfer (ICT) state. In case of using the delayed fluorescent material, which can be converted to an ICT state, as a dopant, the excitons of singlet energy level $S_1$ as well as the excitons of triplet energy level $T_1$ can move to an intermediate energy level state, i.e. ICT state, and then the intermediate stated excitons can be transferred to a ground state ($S_0$; $S_1 \rightarrow ICT \leftarrow T_1$). Since the excitons of singlet energy level $S_1$ as well as the excitons of triplet energy level $T_1$ in the delayed fluorescent material is involved in the luminescence process, the delayed fluorescent material can improve internal quantum efficiency and luminous efficiency.

Since both the Highest Occupied Molecular Orbital (HOMO) and the Lowest Unoccupied Molecular orbital (LUMO) are widely distributed over the whole molecule within the common fluorescent material, it is not possible to inter-convert between the singlet energy level and the triplet energy level within it (selection rule). In contrast, since the delayed fluorescent material, which can be converted to ICT state, has little orbital overlaps between HOMO and LUMO, there is little interaction between the HOMO state molecular orbital and the LUMO state molecular orbital within the delayed fluorescent material. As a result, changes of spin states of electrons do not have an influence on other electrons, and a new charge transfer band (CT band) that does not follow the selection rule is formed in the delayed fluorescent material.

In other words, since the delayed fluorescent material has the electron acceptor moiety spacing apart from the electron donor moiety within the molecule, it exists as a polarized state having a large dipole moment within the molecule. As there is little interaction between HOMO molecular orbital and LUMO molecular orbital in the molecule having the dipole moment of the polarized state, both the triplet energy level excitons and the singlet energy level excitons can be converted to ICT state. Accordingly, the excitons of triplet energy level $T_1$ as well as the excitons of singlet energy level $S_1$ can participate in the luminescence process.

In case of driving an OLED that includes the delayed fluorescent material, 25% excitons of singlet energy level $S_1$ and 75% excitons of triplet energy level $T_1$ are converted to ICT state by heat or electrical field, and then the converted excitons can transfer to the ground state $S_0$ to achieve luminescence. Therefore, the delayed fluorescent material may have 100% internal quantum efficiency in theory.

The delayed fluorescent material must has an energy bandgap $\Delta E_{ST}^{TD}$ equal to or less than about 0.3 eV, for example, from about 0.05 to about 0.3 eV, between the singlet energy level $S_1$ and the triplet energy level $T_1$ so that exciton energy in both the singlet energy level and the triplet energy level can be transferred to the ICT state. Materials having small energy bandgap $\Delta E_{ST}^{TD}$ between the singlet energy level and the triplet energy level can exhibit common florescence as well as delayed fluorescence by Reverse Inter System Crossing (RISC) in which the excitons of triplet energy level $T_1$ can be transferred upwardly to the excitons of singlet energy level $S_1$, and then the exciton of singlet energy level $S_1$ can be transferred to the ground state $S_0$.

Since the delayed fluorescent material can exhibit 100% internal quantum efficiency in theory, it can implement as high luminous efficiency as the conventional phosphorescent material including a heavy metal. However, due to the bond conformation between the electron acceptor-electron donor and the sterical twists in the delayed fluorescent material, and additional charge transfer transition (CT transition) caused by them, the delayed fluorescent material shows broad spectrum in the course of light emission, i.e. broad full width at half maximum (FWHM), which results in poor color purity. In addition, the delayed fluorescent material exhibits short luminous lifetime owing to utilizing the triplet exciton energy as well as the singlet exciton energy.

When a host, a delayed fluorescent material and a fluorescent or phosphorescent material is included in the same single-layered EML, the singlet exciton energy of the delayed fluorescent material is transferred to the fluorescent or phosphorescent material through Dexter resonance energy transfer (DRET) mechanism, which transfers energy by wave function overlaps among adjacent molecules owing to exciton diffusions through intermolecular electron exchanges. In this case, enough exciton energy may not be transferred from the delayed fluorescent material to the fluorescent material, and therefore, the EML may not implement its luminous efficiency and color purity to the desired levels.

On the contrary, the EML1 162 includes the first compound, which may be the first host, and the second compound, which may be the delayed fluorescent dopant, and the EML2 164 includes the third compound, which may be the second host, and the fourth compound, which may be the fluorescent or phosphorescent dopant. When the triplet exciton energy of the second compound in the EML1 162 is converted upwardly to the singlet exciton energy of its own, the converted singlet exciton energy of the second compound is transferred to the fourth compound in the EML2 164 disposed adjacently to the EML1 162 through FRET (Foster resonance energy transfer) mechanism, which transfer exciton energies in a form of non-radiation through an electrical field by a dipole-dipole interaction.

When final light emission is occurred in the fourth compound, the EML 160 can transfer exciton energy efficiently and implement high color purity. As the exciton energy efficiency from the second compound in the EML1 162 to the fourth compound in the EML2 164 disposed adjacently to the EML1 162 improves, the OLED 100 can implement hyper fluorescence having enhanced luminous efficiency. In addition, since the final light emission is occurred when the fourth compound, which has narrower FWHM than the second compound, is transited from the excited state to the ground state in the EML2 164, the color purity can be improved.

Figure 4:
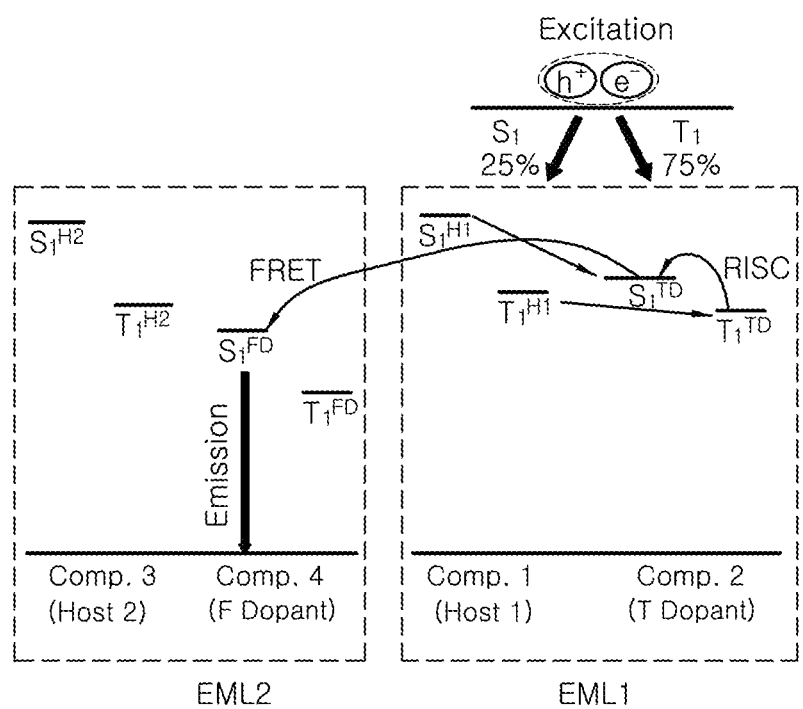
FIG. 4 is a schematic diagram illustrating luminous mechanism by energy levels among luminous materials in accordance with an exemplary embodiment of the present disclosure.

In order to achieve such a hyper fluorescence, it is necessary to adjust energy levels among the luminous materials in the EML 160. FIG. 4 is a schematic diagram illustrating luminous mechanism by energy levels among luminous materials in accordance with an exemplary embodiment of the present disclosure. With referring to FIG. 4, each of excited state singlet energy levels $S_1^{H1}$ and $S_1^{H2}$ and excited state triplet energy levels $T_1^{H1}$ and $T_1^{H2}$ of the first and third compound, which may be the first and second hosts, should be higher than each of an excited state singlet energy level $S_1^{TD}$ and an excited state triplet energy level $T_1^{TD}$ of the second compound, which may the delayed fluorescent dopant, respectively, in order to transfer the exciton energy generated in the hosts to the second compound as the delayed fluorescent material in advance.

As an example, when the excited state triplet energy level $T_1^{H1}$ of the first compound, which may the first host, is not higher enough than the excited state triplet energy level $T_1^{TD}$ of the second compound, which may be the delayed fluorescent dopant, the excitons of the triplet state level $T_1^{TD}$ of the second compound can be reversely transferred to the excited state triplet energy level $T_1^{H1}$ of the first compound. Since the first compound cannot utilize a triplet exciton, the triplet exciton of the second compound transferred to the first compound may be quenched as a non-emission, the triplet state excitons of the second compound as the delayed fluorescent dopant cannot contribute to the light emission. For example, the excited state triplet energy level $T_1^{H1}$ of the first compound may be high by at least 0.2 eV compared to the excited state triplet energy levels $T_1^{TD}$ of the second compound.

In addition, it is necessary to adjust properly Highest Occupied Molecular Orbital (HOMO) energy levels and Lowest Unoccupied Molecular Orbital (LUMO) energy levels of the first and/or third compounds, each of which may be the host, and the second material, which may be the delayed fluorescent dopant. For example, it is preferable that an energy level bandgap ($|HOMO^H-HOMO^{TD}|$) between a Highest Occupied Molecular Orbital energy level (HOMO$^H$) of each of the first and/or third compounds and a Highest Occupied Molecular Orbital energy level (HOMO$^{TD}$) of the second compound, or an energy level bandgap ($|LUMO^H-LUMO^{TD}|$) between a Lowest Unoccupied Molecular Orbital energy level (LUMO$^H$) of each of the first and/or third compounds and a Lowest Unoccupied Molecular Orbital energy level (LUMO$^{TD}$) of the second compound may be equal to or less than about 0.5 eV, for example, between about 0.1 eV to about 0.5 eV. In this case, the charges can be transported efficiently from the first material as the first host to the second compound as the delayed fluorescent dopant and thereby enhancing an ultimate luminous efficiency.

Besides, it may be necessary to transfer energy from the second compound, in which excitons of singlet and triplet energy levels are converted to the ICT state by RISC, in the EML1 162 to the fourth compound, which may be the fluorescent or phosphorescent material, in the EML2 164, so that the OLED 100 can implement high luminous efficiency and high color purity. For realizing such OLED 100, each of the excited state singlet energy levels $S_1^{TD}$ and/or the excited state triplet energy levels $T_1^{TD}$ of the second compound, which may be delayed fluorescent materials, is higher than an excited state singlet energy levels $S_1^{FD}$ and the excited stat triplet energy levels $T_1^{FD}$ of the fourth compound, which may be the fluorescent or phosphorescent dopant. Moreover, the excited state singlet energy level $S_1^{H2}$ of the third compound should be higher than the excited state singlet energy level $S_1^{FD}$ of the fourth compound. In this case, the exciton energy, transferred from the second dopant as the delayed fluorescent dopant to the fourth compound as the fluorescent or phosphorescent dopant, cannot be transferred to the second compound as the second host, and thereby implementing efficient light emission.

As such, it is possible to efficient luminescence by considering the energy levels among the luminous materials in the EML 160. In one exemplary embodiment, each of the first and third compound, each of which is included in the EML1 162 or the EML2 164, may independently include, but are not limited to, an organic compound having the following structure of Chemical Formula 1:

Chemical Formula 1

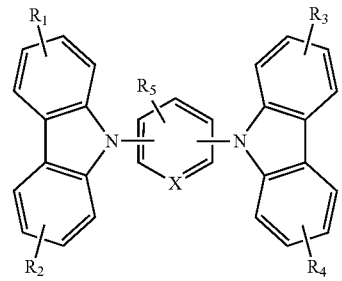

In Chemical Formula 1, each of $R_1$ to $R_5$ is independently selected from the group consisting of protium, deuterium, tritium, $C_5$~$C_{30}$ aryl group and $C_4$~$C_{30}$ hetero aryl group. X is $CR_6$ or nitrogen (N), wherein $R_6$ is protium, deuterium, tritium or $C_1$~$C_{20}$ alkyl group.

Each of the excited state singlet energy levels and the triplet energy levels of the first and third compound having the structure of Chemical Formula 1 is higher than each of the excited state singlet energy level and the triplet energy level of the second compound having the structure of Chemical Formula 3. As a result, the triplet exciton of the second compound having the structure of Chemical Formula 3 cannot be transferred to the excited state triplet energy levels of the first and third compounds having the structure of Chemical Formula 1.

In one exemplary embodiment, the organic compound having the structure of Chemical Formula 1, which may be used as the first and/or third compounds, may include any organic compound having the following structure of Chemical Formula 2:

Chemical Formula 2

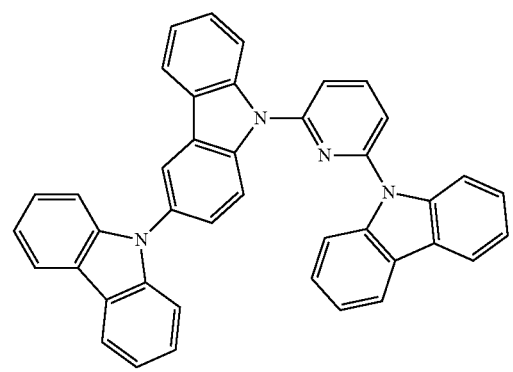

-continued

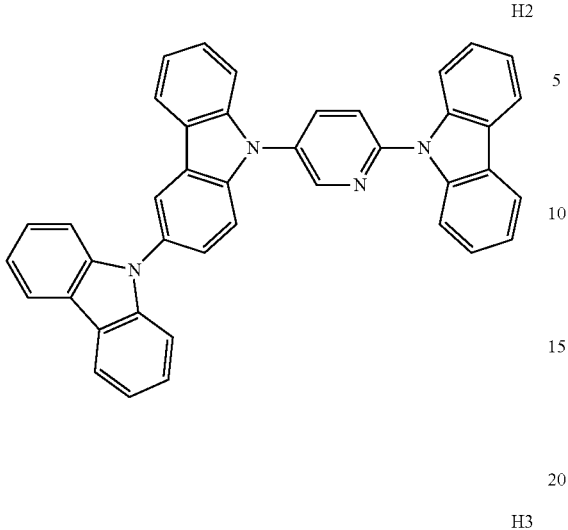
H2

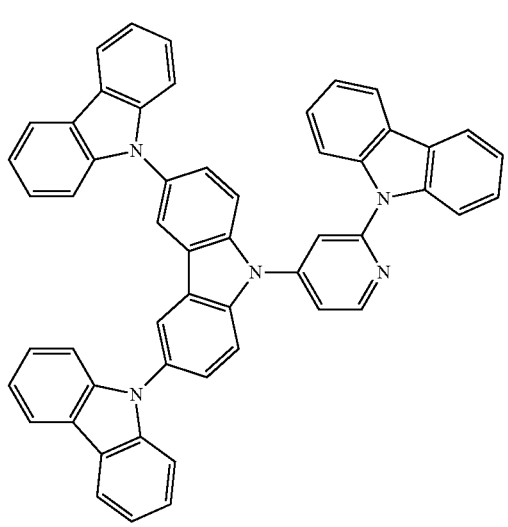
H5

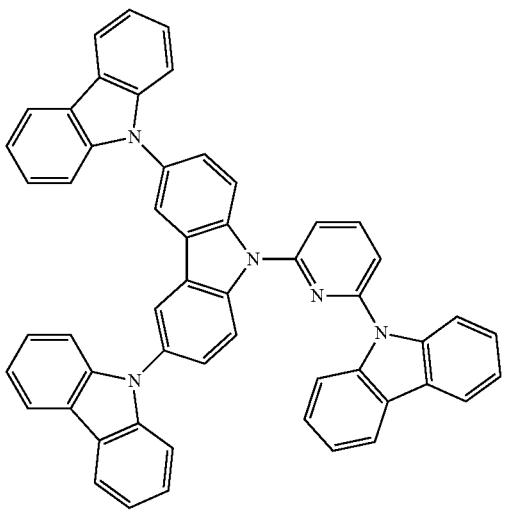
H3

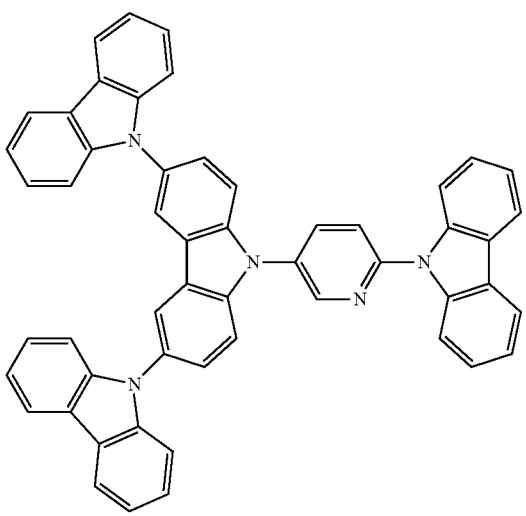
H4

The second compound may include, but are not limited to an organic compound having the following structure of Chemical Formula 3:

Chemical Formula 3

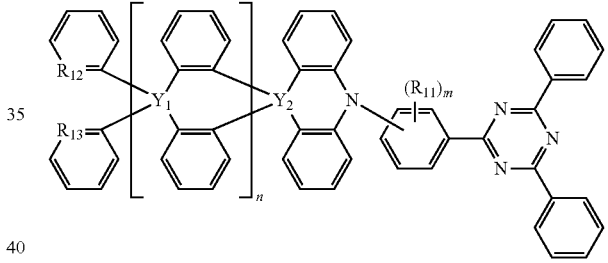

In Chemical Formula 3, $R_{11}$ is selected from the group consisting of protium, deuterium, tritium, $C_5$~$C_{30}$ aryl group and $C_4$~$C_{30}$ hetero aryl group. Each of $R_{12}$ and $R_{13}$ is a carbon (C), wherein each of $R_{12}$ and $R_{13}$ is bonded to protium, deuterium or tritium or $R_{12}$ is bonded to $R_{13}$ directly or through oxygen (O), sulfur (S) or selenium (Se). Each of $Y_1$ and $Y_2$ is independently carbon (C), silicon (Si) or germanium (Ge). m is an integer of 1 to 4. n is an integer of 0 to 2.

The organic compound having the structure of Chemical Formula 3 includes an acridine moiety of a spiro structure, which can act as an electron donor, and a triazine moiety, which can act as an electron acceptor, bonded to the acridine moiety via phenylene linker. As a steric hindrance between the acridine moiety and the triazine moiety becomes larger, the formation of conjugated structure between the spiro-structured acridine moiety as the electron donor and the triazine moiety as the electron acceptor, and thereby, the organic compound having the structure of Chemical Formula 3 can be easily divided into HOMO energy level state and LUMO energy level state. As the difference between the spiro-structured acridine moiety as the electron donor and the triazine moiety as the electron acceptor increase, energy overlap between the HOMO and LUMO is decreased. Accordingly, as the energy bandgap ($\Delta E_{ST}$) between the excited state singlet energy level and the excited state triplet energy level, the organic compound having the structure of Chemical Formula 3 can implement the delayed fluorescent property.

As an example, the organic compound having the structure of Chemical Formula 3 may include any organic compound having the following structure of Chemical Formulae 4 to 6:

Chemical Formula 4

Chemical Formula 5

Chemical Formula 6

In Chemical Formula 4, each of $Z_1$ and $Z_2$ is independently carbon or silicon. n is identical as defined in Chemical Formula 3. In Chemical Formulae 5 and 6, Z is carbon or silicon.

Particularly, the organic compound having the structure of Chemical Formula 3 may include any one organic compound having the following structure of Chemical Formula 7:

Chemical Formula 7

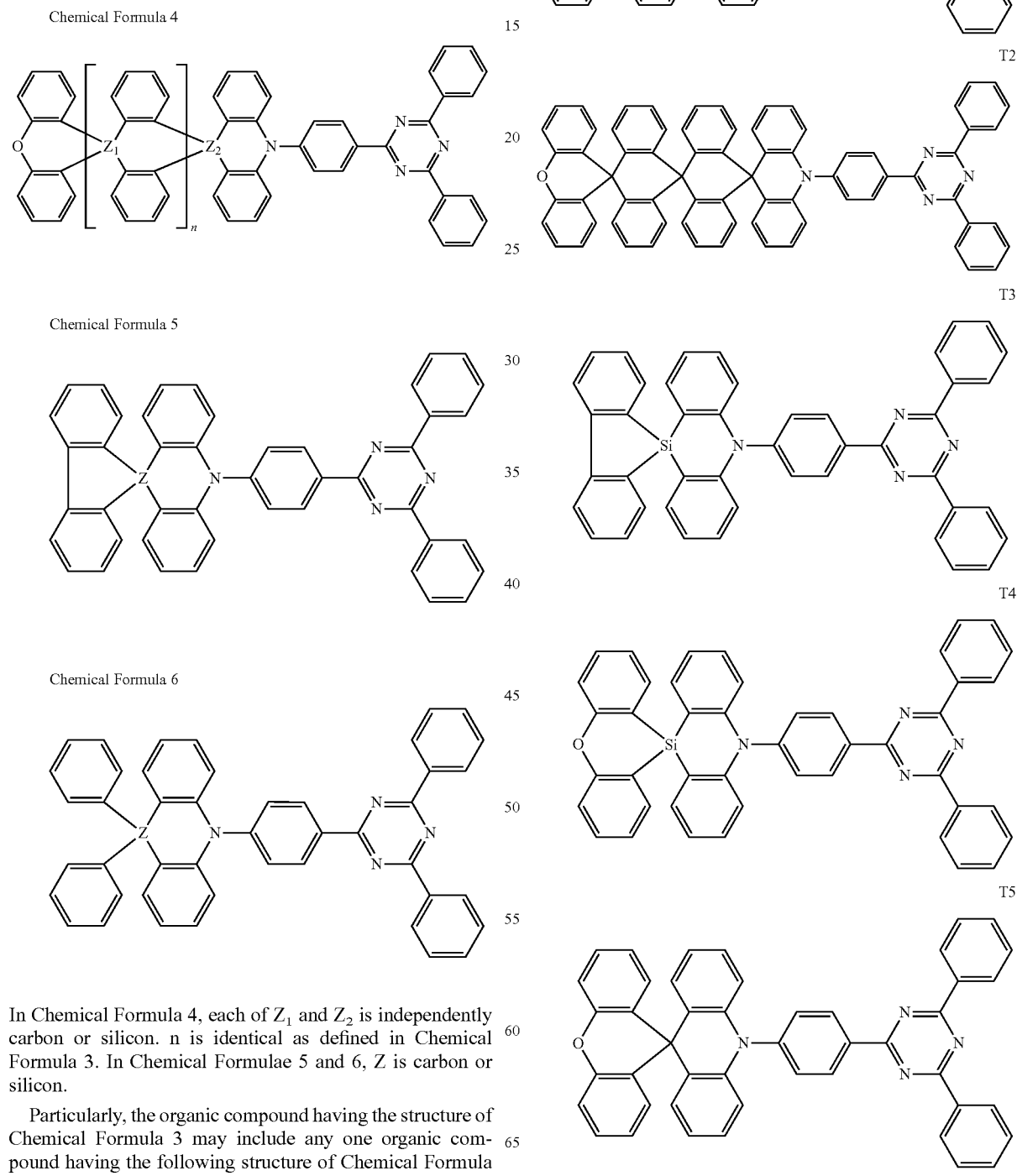

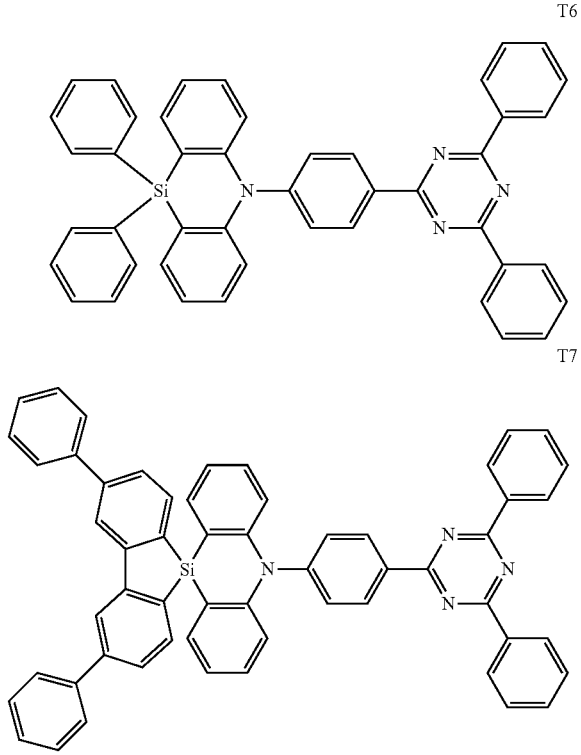

T6

T7

A weight ratio of the first compound, which may be the first host, may be larger than a weight ratio of the second compound, which may be the delayed fluorescent dopant, in the EML1 162. For example, the first compound and the second compound may be mixed with a weight ratio of about 99:1 to about 70:30, preferably about 95:5 to about 70:30, and more preferably about 90:10 to about 70:30, in the EML1 162. When the weight ratio of the second compound is larger than the weight ratio of the first compound, the exciton of the second compound may be self-quenched, and thereby reducing the luminous efficiency in the EML 160.

In addition, it is necessary that the excited state singlet energy level $S_1^{FD}$ of the fourth compound, which may be the fluorescent or phosphorescent dopant, in the EML2 164 may be lower than each of the excited state singlet energy level $S_1^{H2}$ and $S_1^{TD}$ of the third and second compounds, each of which may be the second host and the delayed fluorescent dopant, respectively, in order to implement excellent luminous efficiency in the EML 160. As an example, the fourth compound may include a fluorescent or phosphorescent material having narrow FWHM (full width at half maximum), for example, blue fluorescent material having a FWHM less than about 40 nm, for example, between about 10 nm and about 40 nm. Moreover, fluorescent materials, whose absorption spectra is largely overlapped with emission spectra of the second and/or third compounds and whose wave functions are overlapped with wave functions of the second and/or third compounds, can be used as the fourth compound. In this case, since exciton-exciton quenching among excessively produced excitons and polaron-exciton quenching for producing exciton are minimized in the EML1 162 and EML2 164, the EML 160 can maximize its luminous efficiency and implement blue emission having high color purity.

As an example, the fourth compound in the EML2 164 may include, but are not limited to, anthracene-based compounds, tetracene-based compounds, chrysene-based compounds, phenanthrene-based compounds, pyrene-based compounds, perylene-based compounds, stilbene-based compounds, acridone-based compounds, coumarin-based compounds, phenoxazine-based compound and phenothiazine-based compounds.

Particularly, the fourth compound may include, but are not limited to, 5,6-bis[4-(10-phenyl-9-anthryl)phenyl]-2,2'-bipyridine (PAP2BPy), 5,6-bis[4'-(10-phenyl-9-anthryl)biphenyl-4-yl]-2,2'-bipyridine (PAPP2BPy), N,N'-bis[4-(9-phenyl-9H-fluoren-9-yl)phenyl]-N,N'-diphenyl-pyrene-1,6-diamine (1,6-FLPAPrn), N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), N,9-diphenyl-N-[4-(10-phenyl-9-anthryl)phenyl]-9H-carbazol-3-amine (PCAPA), 2,5,8,11-tetra-tert-butylperylene (TBP), 4-(10-phenyl-9-anthryl)-4'-(9-phenyl-9H-carbazol-3-yl)triphenylamine (PCBAPA), N,9-diphenyl-N-[4-(9,10-diphenyl-2-anthryl)phenyl]-9H-carbazol-3-amine (2PCAPPA), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), 9-triphenylanthracen-9-amine (DPhAPhA), N, N,N'-diphenylquinacridone (DPQd), 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyl)acenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB) and N,N,N',N'-Tetraphenyl-pyrene-1,6-diamine.

A weight ratio of the third compound may be larger than a weight ratio of the fourth compound in the EML2 164. In one exemplary embodiment, the fourth compound may be included between about 1 to about 50% by weight, preferably between about 1 to about 30% by weight, and more preferably between about 1 to about 15% by weight, in the EML2 164.

In the above embodiment, the first compound in the EML1 162 and the third compound in the EML2 164 include the same material, for example, an organic compound having the structure of Chemical Formulae 1 to 2. Unlike that embodiment, the first compound may differ from the third compound. As an example, when the EML2 164 including the fourth compound is disposed more adjacently toward the first electrode 110 than the EML1 162, i.e., the EML2 164 is disposed between the EBL 155 and the EML1 162, as illustrated in FIG. 2, the third compound in the EML2 164 may be the same as a material of the EBL 155. In this case, the EML2 164 may have an electron blocking function as well as an emission function. In other words, the EML2 164 can act as a buffer layer for blocking electrons. In one embodiment, the EBL 155 may be omitted where the EML2 164 may be an electron blocking layer as well as an emitting material layer.

When the EML2 164 is disposed more adjacently toward the second electrode 120 than the EML1 162, i.e., the EML2 164 is disposed between the HBL 175 and the EML1 162 in another exemplary embodiment, the third compound in the EML2 164 may be the same material as the HBL 175. In this case, the EML2 164 may have a hole blocking function as well as an emission function. In other words, the EML2 164 can act as a buffer layer for blocking holes. In one embodiment, the HBL 175 may be omitted where the EML2 164 may be a hole blocking layer as well as an emitting material layer.

Figure 5:
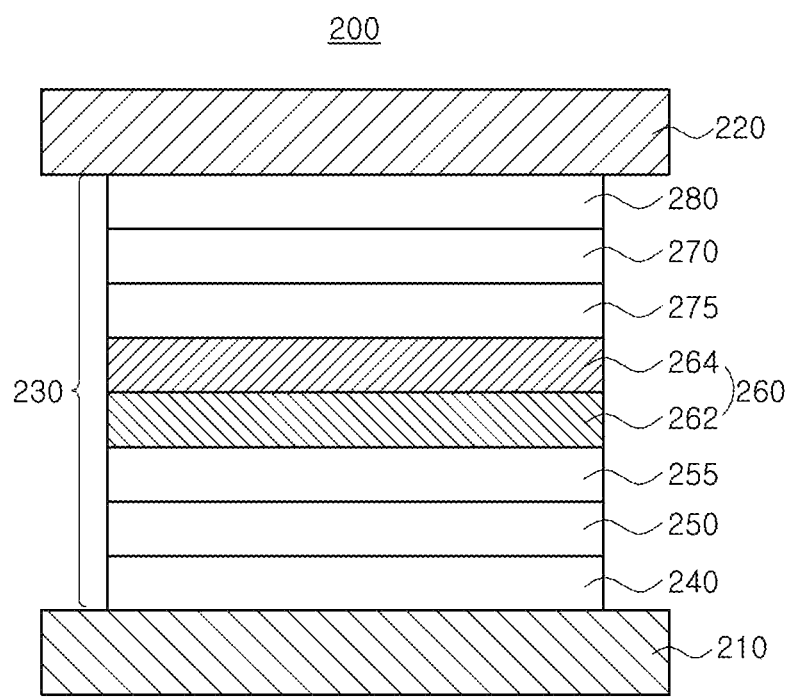
FIG. 5 is a schematic cross-sectional view illustrating an organic light emitting diode in accordance with another exemplary embodiment of the present disclosure.
Figure 6:
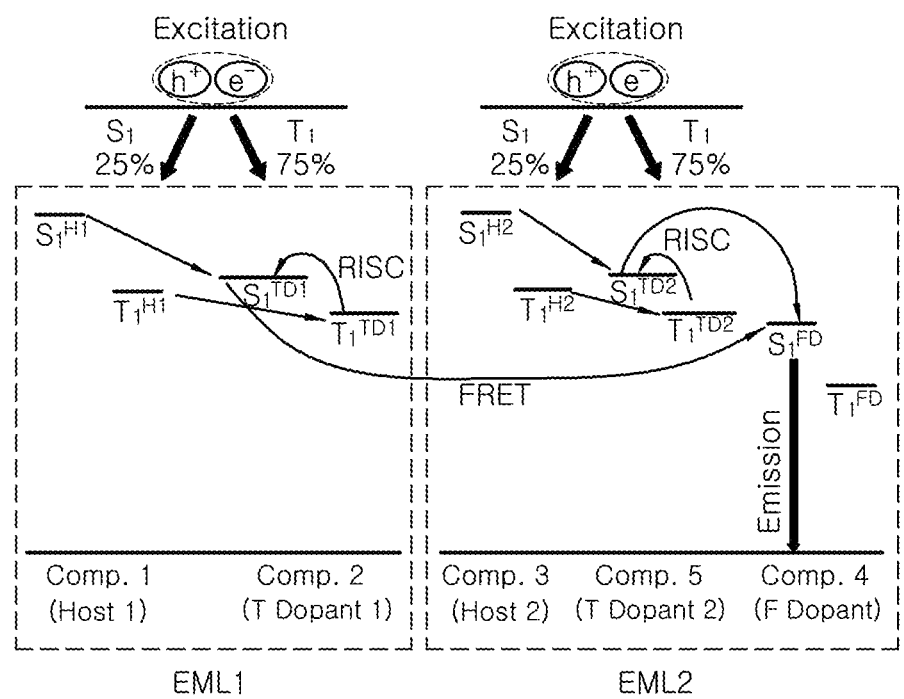
FIG. 6 is a schematic diagram illustrating luminous mechanism by energy levels among luminous materials in accordance with another exemplary embodiment of the present disclosure.

In the first embodiment of the present disclosure, the EML2 162 includes only the third and fourth compounds. The second emitting material layer may further comprise a fifth compound, which may be a second delayed fluorescent dopant. FIG. 5 is a schematic cross-sectional view illustrating an organic light emitting diode in accordance with another exemplary embodiment of the present disclosure and FIG. 6 is a schematic diagram illustrating luminous mechanism by energy levels among luminous materials in accordance with another exemplary embodiment of the present disclosure.

As illustrated in FIG. 5, the OLED 200 in accordance with the second embodiment of the present disclosure includes first and second electrodes 210 and 220 facing each other and an emitting unit 230 disposed between the first and second electrodes 210 and 220. In one exemplary embodiment, the emitting unit 230 as an emission layer includes a HIL 240, a HTL 250, an EML 260, an ETL 270 and an EIL 280 each of which is laminated sequentially from the first electrode 210. Besides, the emitting unit 230 may further include a first exciton blocking layer, i.e. an EBL 255 disposed between the HTL 250 and the EML 260 and/or a second exciton blocking layer, i.e., a HBL 275 disposed between the EML 260 and the ETL 270. The emitting unit 230 may have the same configuration and the same material as the emitting unit 130 in the first embodiment except the EML 260.

The EML 260 includes a first EML (EML1) 262 and a second EML (EML2) 264. The EML1 262 includes a first compound, which may be a first host, and a second compound, which may be a first delayed fluorescent dopant. The EML2 264 includes a third compound, which may be a second host, a fourth compound, which may be a first fluorescent or phosphorescent dopant, and a fifth compound, which may be a second delayed fluorescent dopant. The EML1 262 may be disposed between the EBL 255 and the HBL 275 and the EML2 264 may be disposed between the EBL 255 and the EML1 262 or between the EML1 262 and the HBL 275. Hereinafter, the EML 260, where the EML2 264 is disposed between the HBL 275 and the EML1 262, will be explained.

Each of the first and third compounds, each of which is included in the EML1 262 and the EML2 264, may include independently any organic compound having the structure of Chemical Formulae 1 to 2. Each of the second and fifth compounds, each of which is included in the EML1 262 and the EML2 264, may include any organic compound having the structure of Chemical Formulae 3 to 7.

As an example, when the organic compound having the structure of Chemical Formulae 1 to 2 is used as each of the first and second hosts and the organic compound having the structure of Chemical Formulae 3 to 7 is used as the first and second delayed fluorescent dopants, each of excited state singlet energy levels $S_1^{H1}$ and $S_1^{H2}$ and excited state triplet energy levels $T_1^{H1}$ and $T_1^{H2}$ of the first and third compounds, each of which may be the first and second hosts, respectively, is higher than each of excited state singlet energy levels $S_1^{TD1}$ and $S_1^{TD2}$ and excited state triplet energy levels $T_1^{TD1}$ and $T_1^{TD2}$ of the second and fifth compounds, each of which may be the first and second delayed fluorescent dopants, respectively (See, FIG. 6).

In addition, when the organic compound having the structure of Chemical Formulae 1 and 2 is used as the first and second hosts and the organic compound having the structure of Chemical Formulae 3 to 7 is used as the first and second delayed fluorescent dopants, an energy level bandgap ($|HOMO^H-HOMO^{TD}|$) between HOMO energy levels ($HOMO^H$) of each of the first and third compounds, each of which may be the first and second hosts, respectively, and HOMO energy levels ($HOMO^{TD}$) of each of the second and fifth compounds, each of which may be the first and second dopants, respectively, or an energy level bandgap ($|LUMO^H-LUMO^{TD}|$) between LUMO energy levels ($LUMO^H$) of each of the first and third compounds and LUMO energy levels ($LUMO^{TD}$) of each of the second and fifth compounds may be equal to or less than about 0.5 eV, for example, between about 0.1 eV to about 0.5 eV.

The fourth compound in the EML2 262 may include a blue luminous material having narrow FWHM and thereby high color purity. As an example, fluorescent materials, whose absorption spectra is largely overlapped with emission spectra of the third compound as the second host and/or the second and fifth compounds as the first and second delayed fluorescent dopant and whose wave functions are overlapped with wave functions of the third compound and/or the second and fifth compounds, can be used as the fourth compound.

In this case, the excited state singlet energy levels $S_1^{TD1}$ and $S_1^{TD2}$ and/or the excited state triplet energy levels $T_1^{TD1}$ and $T_1^{TD2}$ of the second and fifth compounds, each of which may be the first and second delayed fluorescent dopants, in the EML1 262 and EML2 264 should be higher than an excited state singlet energy level $S_1^{FD}$ and/or an excited state triplet energy level $T_1^{FD}$ of the fourth compound, which may be the first fluorescent or phosphorescent dopant in the EML2 264, respectively. In addition, the excited state singlet energy level $S_1^{H2}$ of the third compound, which may be the second host in the EML2 264, should be higher than the excited state singlet energy level $S_1^{FD}$ of the fourth compound, which may be the first fluorescent or phosphorescent dopant.

As an example, the fourth compound may include, but are not limited to, anthracene-based compounds, tetracene-based compounds, chrysene-based compounds, phenanthrene-based compounds, pyrene-based compounds, perylene-based compounds, stilbene-based compounds, acridone-based compounds, coumarin-based compounds, phenoxazine-based compound and phenothiazine-based compounds. Particularly, the fourth compound may include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, DPQd, BPT, DCM), DCM2, p-mPhTD, p-mPhAFD, DCJTI, DCJTB and N,N,N',N'-Tetraphenyl-pyrene-1,6-diamine.

In accordance with the second embodiment of the present disclosure, the EML1 262 includes a first compound, which may be the first host, and a second compound, which may be the first delayed fluorescent dopant. The EML2 264 includes a third compound, which may be the second host, a fourth compound, which may the first fluorescent or phosphorescent dopant and a fifth compound, which may be the second delayed fluorescent dopant.

The triplet exciton energy of the second compound, which may be the first delayed fluorescent dopant, in the EML1 262 is converted upwardly to singlet exciton energy of its own by RISC mechanism, the converted singlet exciton energy of the second compound is transferred to the fourth compound, which may be the first fluorescent or phosphorescent dopant, in the EML2 264 via FRET mechanism. In addition, the triplet exciton energy of the fifth compound, which may be the second delayed fluorescent dopant, in the EML2 264 is converted upwardly to singlet exciton energy of its own by RISC mechanism, the converted singlet exciton energy of the fifth compound is transferred to the fourth compound, which may be the first fluorescent or phosphorescent dopant, in the same EML2 264 via DRET mechanism, which transfers energy by wave function overlaps among adjacent molecules owing to exciton diffusions through intermolecular electron exchanges. The EML 260 can implement hyper fluorescence maximizing its luminous efficiency and having excellent color purity since the fourth compound where the final luminescence is occurred receives exciton energies from two delayed fluorescent dopants, i.e. the second and fifth compounds in accordance with the exemplary second embodiment of the present disclosure.

In one exemplary embodiment, a weight ratio of the first compound, which may be the first host, may be larger than a weight ratio of the second compound, which may be the first delayed fluorescent dopant, in the EML1 262. For example, the first compound and the second compound may be mixed with a weight ratio of about 99:1 to about 70:30, preferably about 95:5 to about 70:30, and more preferably about 90:10 to about 70:30, in the EML1 262.

In addition, a weight ratio of the third compound, which may be the second host, may be larger than each weight ratio of the fifth compound, which may be the second delayed fluorescent dopant, and the fourth compound, which may be the first fluorescent or phosphorescent dopant, in the EML2 264. Also, the weight ratio of the fifth compound may be larger than the weight ratio of the fourth compound in the EML2 264. In this case, exciton energy can be transferred efficiently from the fifth compound to the fourth compound by Dexter mechanism.

In one exemplary embodiment, the EML2 264 may include the third and fifth compounds of equal to or more than about 80% by weight. As an example, the EML2 264 may include, but are not limited to, the third compound of about 50 to about 80% by weight, and preferably about 60 to about 80% by weight, the fifth compound of about 10 to about 40% by weight, and preferably about 15 to about 35% by weight, and the fourth compound of about 1 to about 20% by weight, and preferably about 1 to about 5% by weight. For example, when each of the weight ratios of the second and fifth compound is larger than each of the weight ratios of the first and third compounds, the excitons of the second and fifth compounds, which may be the delayed fluorescent dopant, may be self-quenched, and thereby reducing the luminous efficiency in the EML 260.

Similar to the first embodiment, the first compound may differ from the third compound. As an example, when the EML2 264 including the fourth compound is disposed more adjacently toward the first electrode 210 than the EML1 262, i.e., the EML2 264 is disposed between the EBL 255 and the EML1 262, the third compound in the EML2 264 may be the same as a material of the EBL 255. In this case, the EML2 264 may have an electron blocking function as well as an emission function. In other words, the EML2 264 can act as a buffer layer for blocking electrons. In one embodiment, the EBL 255 may be omitted where the EML2 264 may be an electron blocking layer as well as an emitting material layer.

When the EML2 264 is disposed more adjacently toward the second electrode 220 than the EML1 262, as illustrated in FIG. 5, i.e., the EML2 264 is disposed between the HBL 275 and the EML1 262 in another exemplary embodiment, the third compound in the EML2 264 may be the same material as the HBL 275. In this case, the EML2 264 may have a hole blocking function as well as an emission function. In other words, the EML2 264 can act as a buffer layer for blocking holes. In one embodiment, the HBL 275 may be omitted where the EML2 264 may be a hole blocking layer as well as an emitting material layer.

Figure 7:
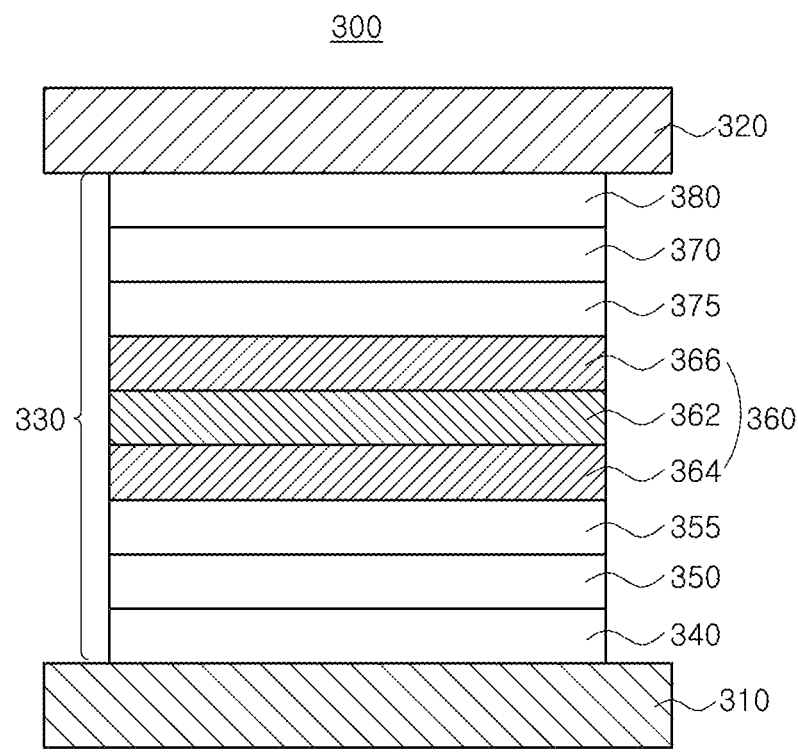
FIG. 7 is a schematic cross-sectional view illustrating an organic light emitting diode in accordance with still another exemplary embodiment of the present disclosure.
Figure 8:
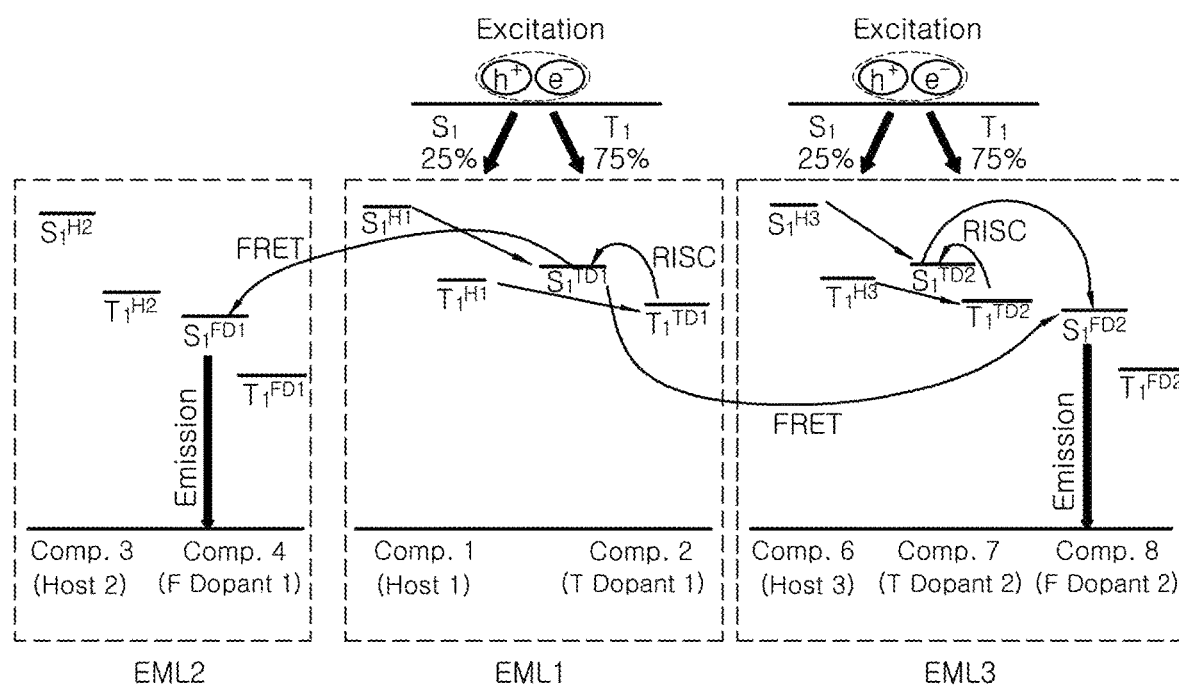
FIG. 8 is a schematic diagram illustrating luminous mechanism by energy levels among luminous materials in accordance with still another exemplary embodiment of the present disclosure.

In the above first and second embodiment, the OLEDs 100 and 200 have two-layered EMLs 160 and 260. The EML may have a three-layered structure. FIG. 7 is a schematic cross-sectional view illustrating an organic light emitting diode in accordance with still another exemplary embodiment of the present disclosure. FIG. 8 is a schematic diagram illustrating luminous mechanism by energy levels among luminous materials in accordance with still another exemplary embodiment of the present disclosure.

As illustrated in FIG. 7, the OLED 300 in accordance with the third embodiment of the present disclosure includes first and second electrodes 310 and 320 facing each other and an emitting unit 330 disposed between the first and second electrodes 310 and 320. In one exemplary embodiment, the emitting unit 330 as an emission layer includes a HIL 340, a HTL 350, an EML 360, an ETL 370 and an EIL 380 each of which is laminated sequentially from the first electrode 310. Besides, the emitting unit 330 may further include a first exciton blocking layer, i.e. an EBL 355 disposed between the HTL 350 and the EML 360 and/or a second exciton blocking layer, i.e., a HBL 375 disposed between the EML 360 and the ETL 370. The emitting unit 330 may have the same configuration and the same material as the emitting units 130 and 230 in the first and second embodiments except the EML 360.

The EML 360 includes a first EML (EML1) 362 including first and second compounds, a second EML (EML2) 364 including third and fourth compounds and a third EML (EML3) 366 including sixth to eighth compounds. The first compound may be the first host and the second compound may be the first delayed fluorescent dopant (TD1). The third compound may be the second host and the fourth compound may be the first fluorescent or phosphorescent dopant (FD1). In addition, the sixth compound may be the third host, the seventh compound may be the second delayed fluorescent dopant (TD2) and the eighth compound may be the second fluorescent or phosphorescent dopant (FD2).

In one exemplary embodiment, the EML1 362 may be disposed between the EBL 355 and the HBL 375, the EML2 364 may be disposed between the EBL 355 and the EML1 362 and the EML3 366 may be disposed between the EML1 362 and the HBL 375. Alternatively, the EML2 364 may be disposed between the EML1 362 and the HBL 375 and the EML3 366 may be disposed between the EBL 355 and the EML1 362. In other words, the EML3 366 is disposed oppositely to the EML2 364 with respect to the EML1 362. Hereinafter, the EML 360, where the EML2 364, the EML1 362 and the EML3 366 are laminated sequentially over the first electrode 310, will be explained.

Each of the first, third, and sixth compounds, each of which may be the first to third hosts and is included in the EML1 362, the EML2 364 and the EML3 366, may include independently any organic compound having the structure of Chemical Formulae 1 to 2. Each of the second and seventh compounds, each of which may be the first and second delayed fluorescent dopants and is included in the EML1 362 and the EML3 366, may include any organic compound having the structure of Chemical Formulae 3 to 7.

As an example, when the organic compound having the structure of Chemical Formulae 1 to 2 is used as each of the first to third hosts and the organic compound having the structure of Chemical Formulae 3 to 7 is used as the first and second delayed fluorescent dopants, each of excited state singlet energy levels $S_1^{H1}$, $S_1^{H2}$ and $S_1^{H3}$ and excited state triplet energy levels $T_1^{H1}$, $T_1^{H2}$ and $T_1^{H3}$ of the first, third and sixth compounds, each of which may be the first to third hosts, respectively, is higher than each of excited state singlet energy levels $S_1^{TD1}$ and $S_1^{TD2}$ and excited state triplet energy levels $T_1^{TD1}$ and $T_1^{TD2}$ of the second and seventh compounds, each of which may be the first and second delayed fluorescent dopants, respectively (See, FIG. 8).

In addition, when the organic compound having the structure of Chemical Formulae 1 and 2 is used as the first to third hosts and the organic compound having the structure of Chemical Formulae 3 to 7 is used as the first and second delayed fluorescent dopants, an energy level bandgap ($|HOMO^H - HOMO^{TD}|$) between HOMO energy levels ($HOMO^H$) of each of the first, third and sixth compounds, each of which may be the first to third host, respectively, and HOMO energy levels ($HOMO^{TD}$) of each of the second and seventh compounds, each of which may be the first and second delayed fluorescent dopants, respectively, or an energy level bandgap ($|LUMO^H - LUMO^{TD}|$) between LUMO energy levels ($LUMO^H$) of each of the first, third and sixth compounds and LUMO energy levels ($LUMO^{TD}$) of each of the second and seventh compounds may be equal to or less than about 0.5 eV, for example, between about 0.1 eV to about 0.5 eV.

Each of the fourth and eight compounds in the EML2 364 and EML3 366 may independently include a blue luminous material having narrow FWHM and thereby high color purity. As an example, fluorescent materials, whose absorption spectra is largely overlapped with emission spectra of the third and sixth compounds as the second and third hosts and/or the second and seventh compounds as the first and second delayed fluorescent dopants, and whose wave functions are overlapped with wave functions of the third and sixth compounds and/or the second and seventh compounds, can be used independently as each of the fourth and eighth compounds.

In this case, the excited state singlet energy levels $S_1^{TD1}$ and $S_1^{TD2}$ and/or the excited state triplet energy levels $T_1^{TD1}$ and $T_1^{TD2}$ of the second and seventh compounds, each of which may be the first and second delayed fluorescent dopants, in the EML1 362 and EML3 366 should be higher than each of excited state singlet energy levels $S_1^{FD1}$ and $S_1^{FD2}$ and/or excited state triplet energy levels $T_1^{FD1}$ and $T_1^{FD2}$ of the fourth and eighth compounds, each of which may be the first and second fluorescent or phosphorescent dopants in the EML2 364 or the EML3 366, respectively. In addition, each of the excited state singlet energy levels $S_1^{H2}$ and $S_1^{H3}$ of the third and sixth compounds, each of which may be the second and third hosts in the EML2 364 or the EML3 366, should be higher than each of the excited state singlet energy levels $S_1^{FD1}$ and $S_1^{FD2}$ of the fourth and eighth compounds, each of which may be the first and second fluorescent or phosphorescent dopants, respectively.

As an example, each of the fourth and eighth compounds may independently include, but are not limited to, anthracene-based compounds, tetracene-based compounds, chrysene-based compounds, phenanthrene-based compounds, pyrene-based compounds, perylene-based compounds, stilbene-based compounds, acridone-based compounds, coumarin-based compounds, phenoxazine-based compound and phenothiazine-based compounds. Particularly, each of the fourth and eighth compounds may independently include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, DPQd, BPT, DCM), DCM2, p-mPhTD, p-mPhAFD, DCJTI, DCJTB and N,N,N',N'-Tetraphenyl-pyrene-1,6-diamine.

In one exemplary embodiment, the first compound and the second compound may be mixed with a weight ratio of about 99:1 to about 70:30, preferably about 95:5 to about 70:30, and more preferably about 90:10 to about 70:30 in the EML1 362. The EML2 364 may include the fourth compound of between about 1 to about 50% by weight, preferably about 1 to about 30% by weight, and more preferably about 1 to about 15% by weight.

Also, the EML3 366 may include the sixth and seventh compounds of equal to or more than 80% by weight. As an example, the EML3 366 may include, but are not limited to, the sixth compound of about 50 to about 80% by weight, and preferably about 60 to about 80% by weight, the seventh compound of about 10 to about 40% by weight, and preferably about 15 to about 35% by weight, and the eighth compound of about 1 to about 20% by weight, and preferably about 1 to about 5% by weight.

In accordance with the third embodiment of the present disclosure, the EML1 362 includes a first compound, which may be the first host, and a second compound, which may be the first delayed fluorescent dopant. The EML2 364, which is disposed adjacently to the EML1 362, includes the third compound, which may be the second host and the fourth compound, which may be the first fluorescent or phosphorescent dopant. In addition, the EML3 366, which is also disposed adjacently to the EML1 362, includes the sixth compound, which may the third host, the seventh compound, which may be the second delayed fluorescent dopant, and the eighth compound, which may be the second fluorescent or phosphorescent dopant.

The triplet exciton energy of the second compound, which may be the first delayed fluorescent dopant, in the EML1 362 is converted upwardly to singlet exciton energy of its own by RISC mechanism, the converted singlet exciton energy of the second compound is transferred to each of the fourth compound, which may be the first fluorescent or phosphorescent dopant, in the EML2 364 and the eighth compound, which may the second fluorescent or phosphorescent dopant, in the EML3 366 via FRET mechanism. In addition, the triplet exciton energy of the seventh compound, which may be the second delayed fluorescent dopant, in the EML3 366 is converted upwardly to singlet exciton energy of its own by RISC mechanism, the converted singlet exciton energy of the seventh compound is transferred to the eighth compound, which may be the second fluorescent or phosphorescent dopant, in the same EML3 366 via DRET mechanism, which transfers energy by wave function overlaps among adjacent molecules owing to exciton diffusions through intermolecular electron exchanges.

In accordance with the third embodiment, the fourth compound, which emits light ultimately, in the EML2 364 receives exciton energy through the second compound in the EML1 362 disposed adjacently to the EML2 364, and the eighth compound, which also emits light ultimately, in the EML3 366 receives exciton energies through two delayed fluorescent dopants, i.e. the second and seventh compounds. In other words, the EML 360 includes a three-layered structure EML1 362, EML2 362 and EML3 366, so that exciton energy transfer is effectively adjusted in the EMLs 362, 364 and 366 in the third embodiment of the present disclosure. In this case, since exciton-exciton quenching among excessively produced excitons and polaron-exciton quenching for producing exciton are minimized in the EML1 362, EML2 364 and EML3 366, the EML 360 can maximize its luminous efficiency. Also, EML 360 can implement hyper fluorescence having high color purity owing to narrow FWHM of the fourth and eighth compounds, each of which may be the first or second fluorescent or phosphorescent dopant.

Similar to the first and second embodiments, each of the first, third, and sixth compounds as the hosts may differ from each other. As an example, when the EML2 364 including the third compound is disposed between the EBL 355 and the EML1 362, the third compound in the EML2 364 may be the same as a material of the EBL 355. The EML2 364 may have an electron blocking function as well as an emission function. In one embodiment, the EBL 355 may be omitted where the EML2 364 may be an electron blocking layer as well as an emitting material layer.

When the EML2 364 is disposed between the HBL 375 and the EML1 362 in another exemplary embodiment, the third compound in the EML2 364 may be the same material as the HBL 375. The EML2 364 may have a hole blocking function as well as an emission function. In one embodiment, the HBL 375 may be omitted where the EML2 364 may be a hole blocking layer as well as an emitting material layer.

In still another exemplary embodiment, the sixth compound in the EML3 366 may be the same as a material of the HBL 375. The EML3 366 may have a hole blocking function as well as an emission function. In one embodiment, the HBL 375 may be omitted where the EML3 366 may be a hole blocking layer as well as an emitting material layer.

In further still another exemplary embodiment, when the EML3 366 is disposed between the EBL 355 and the EML1 362, the sixth compound in the EML3 366 may be the same as a material of the EBL 355. The EML3 366 may have an electron blocking function as well as an emission function. In one embodiment, the EBL 355 may be omitted where the EML3 366 may be an electron blocking layer as well as an emitting material layer.

In still another embodiment, the third compound in the EML2 364 is the same material as the EBL 355 and the sixth compound in the EML3 366 is the same material as the HBL 375. In this case, the EML2 364 may have an electron blocking function as well as an emission function, and the EML3 366 may have a hole blocking function as well as an emission function. In other words, each of the EML2 364 and EML3 366 can act as a buffer layer for blocking electrons and blocking holes, respectively. In one embodiment, the EBL 355 and the HBL 375 may be omitted where the EML2 364 may be an electron blocking layer as well as an emitting material layer and the EML3 366 may be a hole blocking layer as well as an emitting material layer.

When the EML2 364 is disposed adjacently to the HBL 375 and the EML3 366 is disposed adjacently to the EBL 355, the third compound in the EML2 364 is the same material as the HBL 375 and the sixth compound in the EML3 366 is the same material as the EBL 355. In this case, the EML2 364 may have a hole blocking function as well as an emission function, and the EML3 366 may have an electron blocking function as well as an emission function. In other words, each of the EML2 364 and EML3 366 can act as a buffer layer for blocking holes and blocking electrons, respectively. In one embodiment, the EBL 355 and the HBL 375 may be omitted where the EML3 366 may be an electron blocking layer as well as an emitting material layer and the EML2 364 may be a hole blocking layer as well as an emitting material layer.

Figure 9:
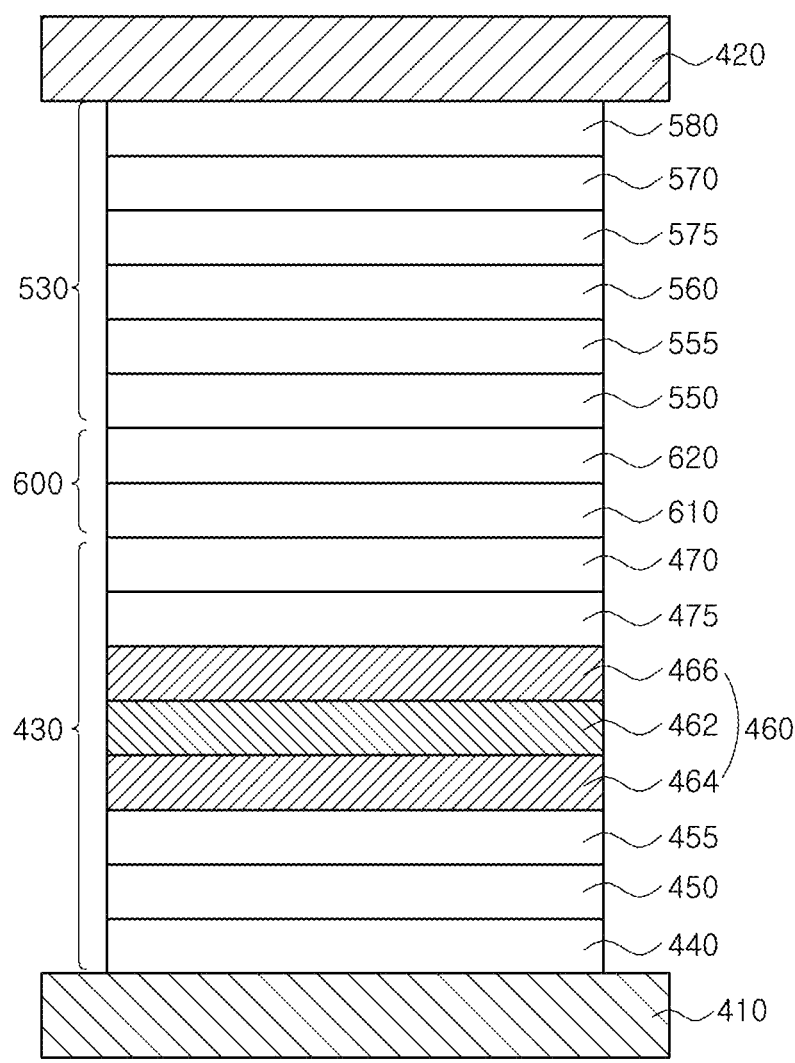
FIG. 9 is a schematic cross-sectional view illustrating an organic light emitting diode in accordance with still another exemplary embodiment of the present disclosure.

In the above first to third embodiments, the OLEDs 100, 200 and 300 includes one emitting unit. The present disclosure can be applied to a tandem-structured OLED, i.e. an OLED having multiple emitting units. FIG. 9 is a is a schematic cross-sectional view illustrating an organic light emitting diode in accordance with still another exemplary embodiment of the present disclosure.

As illustrated in FIG. 9, the OLED 400 in accordance with the fourth embodiment of the present disclosure includes first and second electrodes 410 and 420 facing each other, a first emitting unit 430 as a first emission layer disposed between the first and second electrodes 410 and 420, a second emitting unit 530 as a second emission layer disposed between the first emitting unit 430 and the second electrode 420, and a charge generation layer 600 disposed between the first and second emitting units 430 and 530.

The first electrode 410 may be an anode and include, but are not limited to, a conductive material having a relatively large work function values. As an example, the first electrode 410 may include, but are not limited to, ITO, IZO, SnO, ZnO, ICO, AZO, and the likes.

The second electrode 420 may be a cathode and may include, but are not limited to, a conductive material having a relatively small work function values such as Al, Mg, Ca, Ag, alloy thereof or combination thereof. Each of the first and second electrodes 410 and 420 may be laminated with a thickness of, but are not limited to, about 30 to about 300 nm.

The first emitting unit 430 includes a HIL 440, a first HTL (a lower HTL) 450, a lower EML 460 and a first ETL (a lower ETL) 470. The first emitting unit 430 may further include a first EBL (a lower EBL) 455 disposed between the first HTL 450 and the lower EML 460 and/or a first HBL (a lower HBL) 475 disposed between the lower EML 460 and the first ETL 470.

The second emitting unit 530 includes a second HTL (an upper HTL) 550, an upper EML 560, a second ETL (an upper ETL) 570 and an EIL 580. The second emitting unit 530 may further include a second EBL (an upper EBL) 555 disposed between the second HTL 550 and the upper EML 560 and/or a second HBL (an upper HBL) 575 disposed between the upper EML 560 and the second ETL 570.

At least one of the lower EML 460 and the upper EML 560 may implement blue (B) light emission and has a three-layered structure. Alternatively, one of the lower EML 460 and the upper EML 560 may implement (blue) light emission and has three-layered structure and the other of the lower EML 460 and the upper EML 560 may implement may implement green (G), yellow-green (YG), yellow (Y), orange or red (R) light emission. Hereinafter, the OLED 400, where the lower EML 460 emits blue light and has a three-layered structure and the upper EML 560 emits green, yellow-green, yellow (Y), orange or red light, will be explained.

The HIL 440 is disposed between the first electrode 410 and the first HTL 450 and improves an interface property between the inorganic first electrode 410 and the organic first HTL 450. In one exemplary embodiment, the HIL 440 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 440 may be omitted in compliance with a structure of the OLED 400.

Each of the first and second HTLs 450 and 550 may independently include, but are not limited to, TPD, NPD (NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine. Each of the HIL 440 and the first and second HTLs 450 and 550 may be laminated with a thickness of, but are not limited to, about 5 to about 200 nm, and preferably about 5 to about 100 nm.

Each of the first and second ETLs 470 and 570 facilitates electron transportations in the first emitting unit 430 and the second emitting unit 530, respectively. Each of the first and second ETLs 470 and 570 may independently include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes, respectively. As an example, each of the first and second ETLs 470 and 570 may independently include, but are not limited to, $Alq_3$, PBD, spiro-PBD, Liq, TPBi, BAlq, Bphen, NBphen, BCP, TAZ, NTAZ, TpPyPB, TmPPPyTz, PFNBr, TPQ and/or 2-[4-(9,10-di-2-naphthalenyl-2-anthracenyl)phenyl]-1-phenyl-1H-benzimidazole, respectively.

The EIL 580 is disposed between the second electrode 420 and the second ETL 570, and can improve physical properties of the second electrode 420 and therefore, can enhance the lifetime of the OLED 400. In one exemplary embodiment, the EIL 580 may include, but are not limited to, an alkali halide such as LiF, CsF, NaF, $BaF_2$ and the likes, and/or an organic metal compound such as lithium benzoate, sodium stearate, and the likes.

As an example, each of the first and second EBLs 455 and 555 may independently include, but are not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD and/or TDAPB, respectively.

Each of the first and second HBLs 475 and 575 may independently include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the first and second HBLs 475 and 575 may independently include, but are not limited to, BCP, BAlq, $Alq_3$, PBD, spiro-PBD, Liq, B3PYMPM, DPEPO and combination thereof, respectively.

In one exemplary embodiment, when the upper EML 560 emits green light, the upper EML 560 may be, but are not limited to, phosphorescent material layer including a host such a CBP and the likes and Iridium-based dopants such as Iridium(III)bis(2,4-diphenyloxazolato-N,C3')(acetyl acetonate) (dp2Ir(acac)) and Iridium(III)bis(2-phenyl oxazolinato-N,C')(acetyl acetonate) (dpo2Ir(acac)). Alternatively, the upper EML 560 may be a fluorescent material layer including Alq. In this case, the upper EML 560 may emit green light having, but are not limited to, emission wavelength ranges of about 510 nm to about 570 nm.

In another exemplary embodiment, when the upper EML 560 emits yellow light, the upper EML 560 may have a single-layered structure of yellow-green emitting material layer or a double layered structure of yellow-green and green emitting material layers. As an example, when the upper EML 560 emits yellow light, the yellow emitting material layer includes at least one host selected from CBP and bis(2-methyl-8-quinolinollate)-4-(phenylphenolato)aluminum (BAlq) and a phosphorescent dopant emitting yellow-green light. In this case, the upper EML 560 may emit yellow-green light having, but are not limited to, emission wavelength ranges of about 510 nm to about 590 nm.

In one exemplary embodiment, when the upper EML 560 emits red light, the upper EML 560 may be, but are not limited to, a phosphorescent material layer including a host such as CBP and the likes and at least one dopant selected from the group consisting of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium) and PtOEP(octaethylporphyrin platinum). Alternatively, the upper EML 560 may be a fluorescent material layer including $PBD:Eu(DMB)_3(phen)$, perylene and/or their derivatives. In this case, the upper EML 560 may emit red light having, but are not limited to, emission wavelength ranges of about 600 nm to about 650 nm.

In an alternative embodiment, the upper EML 560 may have two emitting material layers such as a yellow-green emitting material layer and a red emitting material layer.

The charge generation layer (CGL) 600 is disposed between the first emitting unit 430 and the second emitting unit 530. The CGL 600 include an N-type CGL 610 disposed adjacently to the first emitting unit 430 and a P-type CGL 620 disposed adjacently to the second emitting unit 530. The N-type CGL 610 injects electrons into the first emitting unit 430 and the P-type CGL 620 injects holes into the second emitting unit 530.

As an example, the N-type CGL 610 may be a layer doped with an alkali metal such as Li, Na, K and/or Cs and/or an alkaline earth metal such as Mg, Sr, Ba and/or Ra. For example, a host used in the N-type CGL 610 may include, but are not limited to, an organic compound such as Bphen or MTDATA. The alkali metal or the alkaline earth metal may be doped by about 0.01 wt % to about 30 wt %.

The P-type CGL 620 may include, but are not limited to, an inorganic material selected from the group consisting of tungsten oxide ($WO_x$), molybdenum oxide ($MoO_x$), beryllium oxide ($Be_2O_3$), vanadium oxide ($V_2O_5$) and combination thereof, and/or an organic material selected from the group consisting of NPD, HAT-CN, 2,3,5,6-Tetrafluoro-7,7,8,8-tetracyanoquinodimethane (F4TCNQ), TPD, N,N,N',N'-Tetranaphthalenyl-benzidine (TNB), TCTA, N,N'-dioctyl-3,4,9,10-perylenedicarboximide (PTCDI-C8) and combination thereof.

The lower EML 460 includes a first EML (EML1) 462 including first and second compounds, a second EML (EML2) 464 including third and fourth compounds and a third EML (EML3) 466 including sixth to eighth compounds. The first compound may be the first host and the second compound may be the first delayed fluorescent dopant (TD1). The third compound may be the second host and the fourth compound may be the first fluorescent or phosphorescent dopant (FD1). In addition, the sixth compound may be the third host, the seventh compound may be the second delayed fluorescent dopant (TD2) and the eighth compound may be the second fluorescent or phosphorescent dopant (FD2). The EML3 466 is disposed oppositely to the EML2 464 with respect to the EML1 462. Hereinafter, the lower EML 460, where the EML2 464, the EML1 462 and the EML3 466 are laminated sequentially over the first electrode 410, will be explained.

Each of the first, third and sixth compounds, each of which may be the first to third hosts and is included in the EML1 462, the EML2 464 and the EML3 466, may include independently any organic compound having the structure of Chemical Formulae 1 to 2. Each of the second and seventh compounds, each of which may be the first and second delayed fluorescent dopants and is included in the EML1 462 and the EML3 466, may include any organic compound having the structure of Chemical Formulae 3 to 7.

As an example, when the organic compound having the structure of Chemical Formulae 1 to 2 is used as each of the first to third hosts and the organic compound having the structure of Chemical Formulae 3 to 7 is used as the first and second delayed fluorescent dopants, each of excited state singlet energy levels $S_1^{H1}$, $S_1^{H2}$ and $S_1^{H3}$ and excited state triplet energy levels $T_1^{H1}$, $T_1^{H2}$ and $T_1^{H3}$ of the first, third, and sixth compounds, each of which may be the first to third hosts, respectively, is higher than each of excited state singlet energy levels $S_1^{TD1}$ and $S_1^{TD2}$ and excited state triplet energy levels $T_1^{TD1}$ and $T_1^{TD2}$ of the second and seventh compounds, each of which may be the first and second delayed fluorescent dopants, respectively (See, FIG. 8).

In addition, when the organic compound having the structure of Chemical Formulae 1 and 2 is used as the first to third hosts and the organic compound having the structure of Chemical Formulae 3 to 7 is used as the first and second delayed fluorescent dopants, an energy level bandgap ($|HOMO^H - HOMO^{TD}|$) between HOMO energy levels ($HOMO^H$) of each of the first, third and sixth compounds, each of which may be the first to third host, respectively, and HOMO energy levels ($HOMO^{TD}$) of each of the second and seventh compounds, each of which may be the first and second delayed fluorescent dopants, respectively, or an energy level bandgap ($|LUMO^H - LUMO^{TD}|$) between LUMO energy levels ($LUMO^H$) of each of the first, third and sixth compounds and LUMO energy levels ($LUMO^{TD}$) of each of the second and seventh compounds may be equal to or less than about 0.5 eV, for example, between about 0.1 eV to about 0.5 eV.

Each of the fourth and eight compounds in the EML2 464 and EML3 466 may independently include a blue luminous material having narrow FWHM and thereby high color purity. As an example, fluorescent materials, whose absorption spectra is largely overlapped with emission spectra of the third and sixth compounds as the second and third hosts and/or the second and seventh compounds as the first and second delayed fluorescent dopants, and whose wave functions are overlapped with wave functions of the third and sixth compounds and/or the second and seventh compounds, can be used independently as each of the fourth and eighth compounds.

In this case, the excited state singlet energy levels $S_1^{TD1}$ and $S_1^{TD2}$ and/or the excited state triplet energy levels $T_1^{TD1}$ and $T_1^{TD2}$ of the second and seventh compounds, each of which may be the first and second delayed fluorescent dopants, in the EML1 462 and EML3 466 should be higher than each of excited state singlet energy levels $S_1^{FD1}$ and $S_1^{FD2}$ and/or excited state triplet energy levels $T_1^{FD1}$ and $T_1^{FD2}$ of the fourth and eighth compounds, each of which may be the first and second fluorescent or phosphorescent dopants in the EML2 464 or the EML3 466. In addition, each of the excited state singlet energy levels $S_1^{H2}$ and $S_1^{H3}$ of the third and sixth compounds, each of which may be the second and third hosts in the EML2 464 or the EML3 466, should be higher than each of the excited state singlet energy levels $S_1^{FD1}$ and $S_1^{FD2}$ of the fourth and eighth compounds, each of which may be the first and second fluorescent or phosphorescent dopants, respectively.

As an example, each of the fourth and eighth compounds may independently include, but are not limited to, anthracene-based compounds, tetracene-based compounds, chrysene-based compounds, phenanthrene-based compounds, pyrene-based compounds, perylene-based compounds, stilbene-based compounds, acridone-based compounds, coumarin-based compounds, phenoxazine-based compound and phenothiazine-based compounds. Particularly, each of the fourth and eighth compounds may independently include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, DPQd, BPT, DCM), DCM2, p-mPhTD, p-mPhAFD, DCJTI, DCJTB and N,N,N',N'-Tetraphenyl-pyrene-1,6-diamine.

In one exemplary embodiment, the first compound and the second compound may be mixed with a weight ratio of about 99:1 to about 70:30, preferably about 95:5 to about 70:30, and more preferably about 90:10 to about 70:30 in the EML1 462. The EML2 464 may include the fourth compound of between about 1 to about 50% by weight, preferably about 1 to about 30% by weight, and more preferably about 1 to about 15% by weight.

Also, the EML3 466 may include the sixth and seventh compounds of equal to or more than about 80% by weight. As an example, the EML3 466 may include, but are not limited to, the sixth compound of about 50 to about 80% by weight, and preferably about 60 to about 80% by weight, the seventh compound of about 10 to about 40% by weight, and preferably about 15 to about 35% by weight, and the eighth compound of about 1 to about 20% by weight, and preferably about 1 to about 5% by weight.

In accordance with the fourth embodiment of the present disclosure, the EML1 462 includes a first compound, which may be the first host, and a second compound, which may be the first delayed fluorescent dopant. The EML2 464, which is disposed adjacently to the EML1 462, includes the third compound, which may be the second host and the fourth compound, which may be the first fluorescent or phosphorescent dopant. In addition, the EML3 466, which is also disposed adjacently to the EML1 462, includes the sixth compound, which may the third host, the seventh compound, which may be the second delayed fluorescent dopant, and the eighth compound, which may be the second fluorescent or phosphorescent dopant.

The triplet exciton energy of the second compound, which may be the first delayed fluorescent dopant, in the EML1 462 is converted upwardly to singlet exciton energy of its own by RISC mechanism, the converted singlet exciton energy of the second compound is transferred to each of the fourth compound, which may be the first fluorescent or phosphorescent dopant, in the EML2 464 and the eighth compound, which may the second fluorescent or phosphorescent dopant, in the EML3 466 via FRET mechanism. In addition, the triplet exciton energy of the seventh compound, which may be the second delayed fluorescent dopant, in the EML3 466 is converted upwardly to singlet exciton energy of its own by RISC mechanism, the converted singlet exciton energy of the seventh compound is transferred to the eighth compound, which may be the second fluorescent or phosphorescent dopant, in the same EML3 466 via DRET mechanism, which transfers energy by wave function overlaps among adjacent molecules owing to exciton diffusions through intermolecular electron exchanges.

In accordance with the fourth embodiment, the fourth compound, each emits light ultimately, in the EML2 464 receives exciton energy through the second compound in the EML1 462 disposed adjacently to the EML2 464, and the eighth compound, each also emits light ultimately, in the EML3 466 receives exciton energies through two delayed fluorescent dopants, i.e. the second and seventh compounds. In other words, the EML 460 includes a three-layered structure EML1 462, EML2 462 and EML3 466, so that exciton energy transfer is effectively adjusted in the EMLs 462, 464 and 466 in the fourth embodiment of the present disclosure. In this case, since exciton-exciton quenching among excessively produced excitons and polaron-exciton quenching for producing exciton are minimized in the EML1 462, EML2 464 and EML3 466, the lower EML 460 can maximize its luminous efficiency. Also, EML 460 can implement hyper fluorescence having high color purity owing to narrow FWHM of the fourth and eighth compounds, each of which may be the first or second fluorescent or phosphorescent dopant.

Similar to the first to third embodiments, each of the first, third and sixth compounds as the hosts may differ from each other. As an example, when the EML2 464 including the third compound is disposed between the first EBL 455 and the EML1 462, the third compound in the EML2 464 may be the same as a material of the first EBL 455. The EML2 464 may have an electron blocking function as well as an emission function. In one embodiment, the first EBL 455 may be omitted where the EML2 464 may be an electron blocking layer as well as an emitting material layer.

When the EML2 464 is disposed between the first HBL 475 and the EML1 462 in another exemplary embodiment, the third compound in the EML2 464 may be the same material as the first HBL 475. The EML2 464 may have a hole blocking function as well as an emission function. In one embodiment, the first HBL 475 may be omitted where the EML2 464 may be a hole blocking layer as well as an emitting material layer.

In still another exemplary embodiment, the sixth compound in the EML3 466 may be the same as a material of the first HBL 475. The EML3 466 may have a hole blocking function as well as an emission function. In one embodiment, the first HBL 475 may be omitted where the EML3 466 may be a hole blocking layer as well as an emitting material layer.

In further still another exemplary embodiment, when the EML3 466 is disposed between the first EBL 455 and the EML1 462, the sixth compound in the EML3 466 may be the same as a material of the first EBL 455. The EML3 466 may have an electron blocking function as well as an emission function. In one embodiment, the first EBL 455 may be omitted where the EML3 466 may be an electron blocking layer as well as an emitting material layer.

In still another embodiment, the third compound in the EML2 464 is the same material as the first EBL 455 and the sixth compound in the EML3 466 is the same material as the first HBL 475. In this case, the EML2 464 may have an electron blocking function as well as an emission function, and the EML3 466 may have a hole blocking function as well as an emission function. In other words, each of the EML2 464 and EML3 466 can act as a buffer layer for blocking electrons and blocking holes, respectively. In one embodiment, the first EBL 455 and the first HBL 475 may be omitted where the EML2 464 may be an electron blocking layer as well as an emitting material layer and the EML3 466 may be a hole blocking layer as well as an emitting material layer.

When the EML2 464 is disposed adjacently to the first HBL 475 and the EML3 466 is disposed adjacently to the first EBL 455, the third compound in the EML2 464 is the same material as the first HBL 475 and the sixth compound in the EML3 466 is the same material as the first EBL 455. In this case, the EML2 464 may have a hole blocking function as well as an emission function, and the EML3 466 may have an electron blocking function as well as an emission function. In other words, each of the EML2 464 and EML3 466 can act as a buffer layer for blocking holes and blocking electrons, respectively. In one embodiment, the first EBL 455 and the first HBL 475 may be omitted where the EML3 466 may be an electron blocking layer as well as an emitting material layer and the EML2 464 may be a hole blocking layer as well as an emitting material layer.

In an alternative embodiment, the lower EML 460 may have a double-layered structure as illustrated in FIG. 2 or FIG. 5. In this case, the lower EML 660 may include a first EML and a second EML. The first EML may include first and second compounds, and the second EML may include third and fourth compounds, and optionally the fifth compound.

In another exemplary embodiment, an OLED of the present disclosure may further include a third emitting unit (not shown) disposed between the second emitting unit 530 and the second electrode 420 and a second CGL (not shown) disposed between the second emitting unit 530 and the third emitting unit (not shown). In this case, at least one of the first emitting unit 430, the second emitting unit 530, and the third emitting unit (not shown) may include a double-layered structure or a triple-layered structure.

Example 1: Manufacture of Organic Light Emitting Diode (OLED)

An organic light emitting diode including a second emitting material layer (EML 2), having fluorescent material, and a first EML (EML1), having a delayed fluorescent material, each of which laminated sequentially, between first and second electrodes, was fabricated (hereinafter, this type OLED will be referred to 'F/T OLED'). Each of EML1 and EML2 includes a host, H1 in Chemical Formula 1. The EML1 further includes the fluorescent dopant N,N,N',N'-tetrapheynl-pyren-1-6-diamine and the EML2 further includes the delayed fluorescent dopant, T1 in Chemical Formula 7.

A glass substrate attaching ITO was patterned to have an illumination area of 3 mm×3 mm and washed by UV-Ozone. The substrate was transferred to a vacuum chamber for depositing emission layer, the chamber was set to have base pressure of $1 \times 10^{-6}$ Torr, and emission layer and a cathode were deposited as the following order: A hole injection layer (HIL) (HAT-CN; 50 Å); a hole transport layer (HTL) (α-NPB, 500-1500 Å); an electron blocking layer (EBL) (TCTA; 50 Å); an EML2 (H1 (host): N,N,N',N'-tetrapheynl-pyren-1-6-diamine (fluorescent dopant)=95:5 by weight; 50 Å; an EML1 (H1 (host): T1 (delayed fluorescent dopant) =90:10 by weight; 300 Å); an electron transport layer (ETL) (2-[4-(9,10-di-2-naphthalenyl-2-anthracenyl)phenyl]-1-phenyl-benzimdazole; 300 Å); an electron injection layer (EIL) (LiF; 10 Å); and a cathode (Al; 800-1000 Å).

And then, a cappling layer (CPL) was deposited over the cathode and the device was encapsualted by glass. After deposition of emissve layer and the cathode, the OLED was transferred from the depostion chamber to a dry box for film formation, followed by encapsulation using UV-curable epoxy and moisture getter. The manufacture organic light emitting diode had an emision area of 9 mm².

Example 2~12: Manufacture of OLED

An F/T OLED was manufactured as the same process and the same materials as Example 1 except that EML1 includes H1:T1=70:30 by weight (Example 2), H1:T1=50:50 by weight (Example 3), H1:T2=90:10 by weight (Example 4), H1:T2=70:30 by weight (Example 5), H1:T2=50:50 by weight (Example 6), H2:T1=90:10 (Example 7), H2:T1=70:30 by weight (Example 8), H2:T1=50:50 by weight (Example 9), H2:T2=90:10 by weight (Example 10), H2:T2=70:30 by weight (Example 11), and H2:T2=50:50 by weight (Example 12) as the host and the delayed fluorescent dopant.

Comparative Example: Manufacture of OLED

An organic light emitting diode was manufactured as the same process as Example 1 except laminating a single-layered EML (thickness 300 Å) that includes MADN (2-methyl-9,10-bis(naphthalene-2-yl)anthracene; 70 wt %) as a host, 2CzPN (4,5-di(9H-carbazol-9-yl)phthalonitrile (30 wt %) as a delayed fluorescent dopant (Ref.).

Experimental Example 1: Measurement of Luminous Properties of OLED

Each of the organic light emitting diode manufactured by Examples 1 to 12 and Comparative Example was connected to an external power source and luminous properties for all the diodes were evaluated using a constant current source (KEITHLEY) and a photometer PR650 at room temperature. In particular, driving voltage (V), power efficiency (lm/W), external quantum efficiency (EQE; %), and color coordinates at a current density of 10 mA/cm$^2$ of the light emitting diodes of Examples 1 to 12 and Comparative Example were measured. The measurement results are shown in the following Table 1.

TABLE 1

Luminous Properties of F/T OLED

| Sample | Voltage | lm/w | EQE | CIEx, CIEy |
|---|---|---|---|---|
| Ref. (MADN:2CzPN = 7:3) | 4.4 | 16.5 | 9.9 | 0.222, 0.357 |
| Ex. 1 (H1:T1 = 9:1) | 4.6 | 17.1 | 11.2 | 0.159, 0.337 |
| Ex. 2 (H1:T1 = 7:3) | 4.2 | 19.2 | 14.7 | 0.163, 0.282 |
| Ex. 3 (H1:T1 = 5:5) | 4.1 | 15.2 | 12.3 | 0.171, 0.299 |
| Ex. 4 (H1:T2 = 9:1) | 4.5 | 16.9 | 11.8 | 0.161, 0.282 |
| Ex. 5 (H1:T2 = 7:3) | 4.3 | 17.6 | 13.9 | 0.157, 0.289 |
| Ex. 6 (H1:T2 = 5:5) | 4.1 | 15.1 | 12.9 | 0.159, 0.279 |
| Ex. 7 (H2:T1 = 9:1) | 4.5 | 16.1 | 13.1 | 0.157, 0.262 |
| Ex. 8 (H2:T1 = 7:3) | 4.5 | 18.2 | 14.1 | 0.163, 0.256 |
| Ex. 9 (H2:T1 = 5:5) | 4.4 | 14.7 | 11.5 | 0.166, 0.271 |
| Ex. 10 (H2:T2 = 9:1) | 4.3 | 17.1 | 14.4 | 0.174, 0.311 |
| Ex. 11 (H2:T2 = 7:3) | 4.1 | 17.4 | 14.7 | 0.177, 0.307 |
| Ex. 12 (H2:T2 = 5:5) | 4.0 | 16.3 | 14.1 | 0.179, 0.319 |

As indicated in Table 1, compared to the OLED including the single-layered EML in the Comparative Example, the F/T OLED including double-layered EML comprising a first EML having the host and the delayed fluorescent material and a second EML having the second host and the fluorescent material in Examples 1 to 12 lowered its driving voltage up to 9.1%, improved its power efficiency up to 16.4% and its EQE up to 48.5% and implemented blue light emission having much higher color purity. Particularly, when the EML1 includes the host and the delayed fluorescent dopant with a weight ratio of 9:1 or 7:3, the OLED showed much more improved luminous efficiency. These results indicate that the luminous efficiency of the OLED may be decreased when the delayed fluorescent dopant is excessively doped with the host owing the self-quenching phenomenon of the delayed fluorescent dopant.

Examples 13~24: Manufacture of OLED

An F/T OLED was manufactured as the same process and the same materials as Example 1 except EML1 includes H1:T3=90:10 by weight (Example 13), H1:T3=70:30 by weight (Example 14), H1:T3=50:50 by weight (Example 15), H1:T5=90:10 by weight (Example 16), H1:T5=70:30 by weight (Example 17), H1:T5=50:50 by weight (Example 18), H2:T3=90:10 (Example 19), H2:T3=70:30 by weight (Example 20), H2:T3=50:50 by weight (Example 21), H2:T5=90:10 by weight (Example 22), H2:T5=70:30 by weight (Example 23), and H2:T5=50:50 by weight (Example 24) as the host and the delayed fluorescent dopant.

Experimental Example 2: Measurement of Luminous Properties of OLED

Luminous properties of each of the organic light emitting diode manufactured by Examples 13 to 24 and Comparative Example were measured as the same process as Experimental Example 1. The measurement results are shown in the following Table 2.

TABLE 2

Luminous Properties of F/T OLED

| Sample | Voltage | lm/w | EQE | CIEx, CIEy |
|---|---|---|---|---|
| Ref. (MADN:2CzPN = 7:3) | 4.4 | 16.5 | 9.9 | 0.222, 0.357 |
| Ex. 13 (H1:T3 = 9:1) | 4.5 | 13.1 | 10.2 | 0.161, 0.317 |
| Ex. 14 (H1:T3 = 7:3) | 4.4 | 14.1 | 10.4 | 0.161, 0.309 |
| Ex. 15 (H1:T3 = 5:5) | 4.4 | 12.8 | 9.8 | 0.177, 0.319 |
| Ex. 16 (H1:T5 = 9:1) | 4.4 | 15.9 | 12.1 | 0.168, 0.312 |
| Ex. 17 (H1:T5 = 7:3) | 4.3 | 16.4 | 13.1 | 0.159, 0.310 |
| Ex. 18 (H1:T5 = 5:5) | 4.3 | 14.1 | 11.9 | 0.161, 0.315 |
| Ex, 19 (H2:T3 = 9:1) | 4.5 | 17.1 | 12.1 | 0.162, 0.312 |
| Ex. 20 (H2:T3 = 7:3) | 4.3 | 19.2 | 13.4 | 0.162, 0.308 |
| Ex. 21 (H2:T3 = 5:5) | 4.2 | 17.7 | 11.5 | 0.169, 0.305 |
| Ex. 22 (H2:T5 = 9:1) | 4.8 | 7.1 | 10.4 | 0.150, 0.208 |
| Ex. 23 (H2:T5 = 7:3) | 4.7 | 7.9 | 10.7 | 0.142, 0.217 |
| Ex. 24 (H2:T5 = 5:5) | 4.5 | 6.3 | 8.1 | 0.149, 0.226 |

As indicated in Table 2, compared to the OLED including the single-layered EML in the Comparative Example, the F/T OLED in Examples 13 to 24 lowered its driving voltage up to 4.5%, improved its power efficiency up to 16.4% and its EQE up to 35.4% and implemented blue light emission having much higher color purity. Particularly, when the EML1 includes the host and the delayed fluorescent dopant with a weight ratio of 9:1 or 7:3, the OLED showed much more improved luminous efficiency.

Example 25: Manufacture of Organic Light Emitting Diode (OLED)

An organic light emitting diode including a first emitting material layer (EML 1), having a delayed fluorescent material, and a second EML (EML2), having a delayed fluorescent material and a fluorescent material, each of which laminated sequentially, between first and second electrodes, was fabricated (hereinafter, this type OLED will be referred to 'T/A OLED'). Each of EML1 and EML2 includes a host, H1 in Chemical Formula 2. The EML1 further includes the delayed fluorescent dopant T1 and the EML2 further includes the delayed fluorescent dopant T1 and the fluorescent dopant N,N,N',N'-tetrapheynl-pyren-1-6-diamine. Particularly, an OLED was manufactured as the same process and the same material as Example 1 except that EML1 includes H1:T1=70:30 by weight (300 Å) and the EML2 includes H1:T1: dopant N,N,N',N'-tetrapheynl-pyren-1-6-diamine=69:30:1 by weight (50 Å).

Examples 26~36: Manufacture of OLED

A T/A OLED was manufactured as the same process and the same materials as Example 25 except that EML1 includes H1:T1=70:30 by weight (Example 26), H1:T1=50:50 by weight (Example 27), H1:T2=90:10 by weight (Example 28), H1:T2=70:30 by weight (Example 29), H1:T2=50:50 by weight (Example 30), H2:T1=90:10 (Example 31), H2:T1=70:30 by weight (Example 32), H2:T1=50:50 by weight (Example 33), H2:T2=90:10 by weight (Example 34), H2:T2=70:30 by weight (Example 35), and H2:T2=50:50 by weight (Example 36) as the host and the delayed fluorescent dopant.

Experimental Example 3: Measurement of Luminous Properties of OLED

Luminous properties of each of the organic light emitting diode manufactured by Examples 25 to 36 and Comparative Example were measured as the same process as Experimental Example 1. The measurement results are shown in the following Table 3.

TABLE 3

Luminous Properties of T/A OLED

| Sample | Voltage | lm/w | EQE | CIEx, CIEy |
|---|---|---|---|---|
| Ref. (MADN:2CzPN = 7:3) | 4.4 | 16.5 | 9.9 | 0.222, 0.357 |
| Ex. 25 (H1:T1 = 9:1) | 4.3 | 16.7 | 12.3 | 0.159, 0.302 |
| Ex. 26 (H1:T1 = 7:3) | 4.3 | 17.3 | 13.2 | 0.163, 0.292 |
| Ex. 27 (H1:T1 = 5:5) | 4.3 | 15.4 | 11.2 | 0.171, 0.289 |
| Ex. 28 (H1:T2 = 9:1) | 4.4 | 17.9 | 12.1 | 0.161, 0.307 |
| Ex. 29 (H1:T2 = 7:3) | 4.3 | 18.2 | 12.7 | 0.157, 0.287 |
| Ex. 30 (H1:T2 = 5:5) | 4.3 | 16.3 | 13.4 | 0.159, 0.301 |
| Ex. 31 (H2:T1 = 9:1) | 4.4 | 16.4 | 13.4 | 0.157, 0.259 |
| Ex. 32 (H2:T1 = 7:3) | 4.3 | 16.8 | 14.0 | 0.163, 0.266 |
| Ex. 33 (H2:T1 = 5:5) | 4.3 | 15.2 | 12.7 | 0.166, 0.271 |
| Ex. 34 (H2:T2 = 9:1) | 4.2 | 18.2 | 13.4 | 0.174, 0.314 |
| Ex. 35 (H2:T2 = 7:3) | 4.1 | 19.3 | 14.5 | 0.177, 0.309 |
| Ex. 36 (H2:T2 = 5:5) | 4.0 | 18.3 | 13.1 | 0.179, 0.323 |

As indicated in Table 3, compared to the OLED including the single-layered EML in the Comparative Example, the T/A OLED in Examples 25 to 36 lowered its driving voltage up to 9.1%, improved its power efficiency up to 17.0% and its EQE up to 46.5% and implemented blue light emission having much higher color purity. Particularly, when the EML1 includes the host and the delayed fluorescent dopant with a weight ratio of 9:1 or 7:3, the OLED showed much more improved luminous efficiency.

Examples 37-48: Manufacture of OLED

A T/A OLED was manufactured as the same process and the same materials as Example 25 except EML1 includes H1:T3=90:10 by weight (Example 37), H1:T3=70:30 by weight (Example 38), H1:T3=50:50 by weight (Example 39), H1:T5=90:10 by weight (Example 40), H1:T5=70:30 by weight (Example 41), H1:T5=50:50 by weight (Example 42), H2:T3=90:10 (Example 43), H2:T3=70:30 by weight (Example 44), H2:T3=50:50 by weight (Example 45), H2:T5=90:10 by weight (Example 46), H2:T5=70:30 by weight (Example 46), and H2:T5=50:50 by weight (Example 48) as the host and the delayed fluorescent dopant.

Experimental Example 4: Measurement of Luminous Properties of OLED

Luminous properties of each of the organic light emitting diode manufactured by Examples 37 to 48 and Comparative Example were measured as the same process as Experimental Example 1. The measurement results are shown in the following Table 4.

TABLE 4

Luminous Properties of T/A OLED

| Sample | Voltage | lm/w | EQE | CIEx, CIEy |
|---|---|---|---|---|
| Ref. (MADN:2CzPN = 7:3) | 4.4 | 16.5 | 9.9 | 0.222, 0.357 |
| Ex. 37 (H1:T3 = 9:1) | 4.4 | 12.8 | 9.9 | 0.162, 0.302 |
| Ex. 38 (H1:T3 = 7:3) | 4.3 | 14.3 | 10.1 | 0.159, 0.311 |
| Ex. 39 (H1:T3 = 5:5) | 4.2 | 13.2 | 9.8 | 0.167, 0.321 |
| Ex. 40 (H1:T5 = 9:1) | 4.3 | 14.2 | 11.8 | 0.159, 0.311 |
| Ex. 41 (H1:T5 = 7:3) | 4.3 | 17.1 | 13.4 | 0.163, 0.307 |
| Ex. 42 (H1:T5 = 5:5) | 4.3 | 15.5 | 12.1 | 0.167, 0.319 |
| Ex. 43 (H2:T3 = 9:1) | 4.4 | 17.6 | 12.7 | 0.162, 0.318 |
| Ex. 44 (H2:T3 = 7:3) | 4.3 | 19.2 | 13.4 | 0.163, 0.309 |
| Ex. 45 (H2:T3 = 5:5) | 4.2 | 17.8 | 12.5 | 0.167, 0.325 |
| Ex. 46 (H2:T5 = 9:1) | 4.7 | 7.8 | 10.9 | 0.159, 0.198 |
| Ex. 47 (H2:T5 = 7:3) | 4.6 | 8.2 | 11.7 | 0.150, 0.187 |
| Ex. 48 (H2:T5 = 5:5) | 4.6 | 8.0 | 11.1 | 0.155, 0.201 |

As indicated in Table 4, compared to the OLED including the single-layered EML in the Comparative Example, the T/A OLED in Examples 37 to 48 lowered its driving voltage up to 4.5%, improved its power efficiency up to 16.4% and its EQE up to 35.4% and implemented blue light emission having much higher color purity. Particularly, when the EML1 includes the host and the delayed fluorescent dopant with a weight ratio of 9:1 or 7:3, the OLED showed much more improved luminous efficiency.

Example 49: Manufacture of Organic Light Emitting Diode (OLED)

An organic light emitting diode including a second emitting material layer (EML 2), having a fluorescent material, and a first EML (EML1), having a delayed fluorescent material and a third EML (EML3), having a delayed fluorescent material and a fluorescent material, each of which laminated sequentially, between first and second electrodes, was fabricated (hereinafter, this type OLED will be referred to 'F/T/A OLED'). Each of EML1 and EML2 includes a host, H1 in Chemical Formula 2. The EML2 further includes the fluorescent dopant N,N,N',N'-tetrapheynl-pyren-1-6-diamine. The EML1 further includes the delayed fluorescent dopant T1. The EML3 further includes the delayed fluorescent dopant T1 and the fluorescent dopant N,N,N',N'-tetrapheynl-pyren-1-6-diamine. Particularly, an OLED was manufactured as the same process and the same material as Example 1 except that EML2 includes H1:N,N,N',N'-tetrapheynl-pyren-1-6-diamine=95:5 by weight (50 Å), the EML1 includes H1:T1=70:30 by weight (300 Å) and the EML3 includes H1:T1: N,N,N',N'-tetrapheynl-pyren-1-6-diamine=69:30:1 by weight (50 Å).

Examples 50~59: Manufacture of OLED

An F/T/A OLED was manufactured as the same process and the same materials as Example 49 except that each of EML1 and EML3 includes H1 and T2 (Example 50), H1 and T3 (Example 51), H1 and T5 (Example 52), H1 and T6 (Example 53), H1 and T7 (Example 54), H2 and $T_1$ (Example 55), H2 and T2 (Example 56), H2 and T3 (Example 57), H2 and T5 (Example 58) and H2 and T6 (Example 59) as the host and the delayed fluorescent dopant In place of H1 and H2.

Experimental Example 5: Measurement of Luminous Properties of OLED

Figure 10:
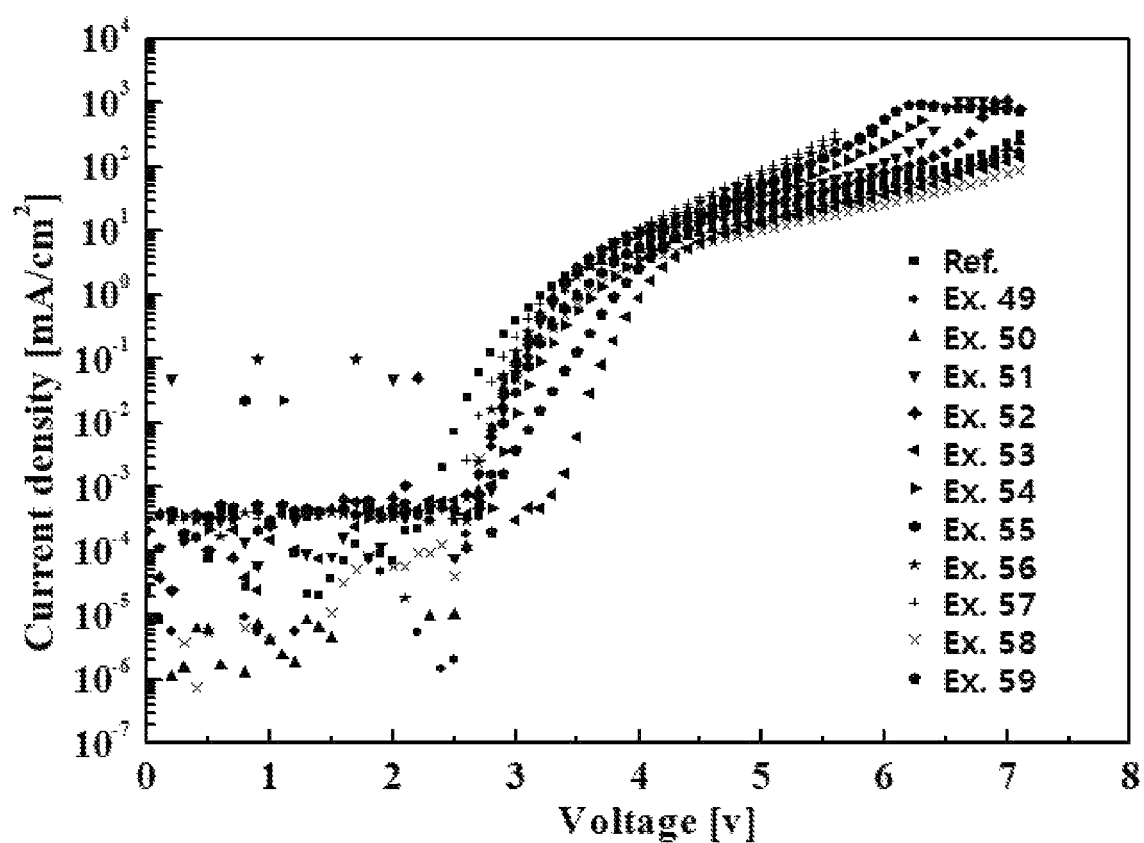
FIG. 10 is a graph illustrating measurement results of voltage-current density of OLEDs fabricated in accordance with Examples of the present disclosure.
Figure 11:
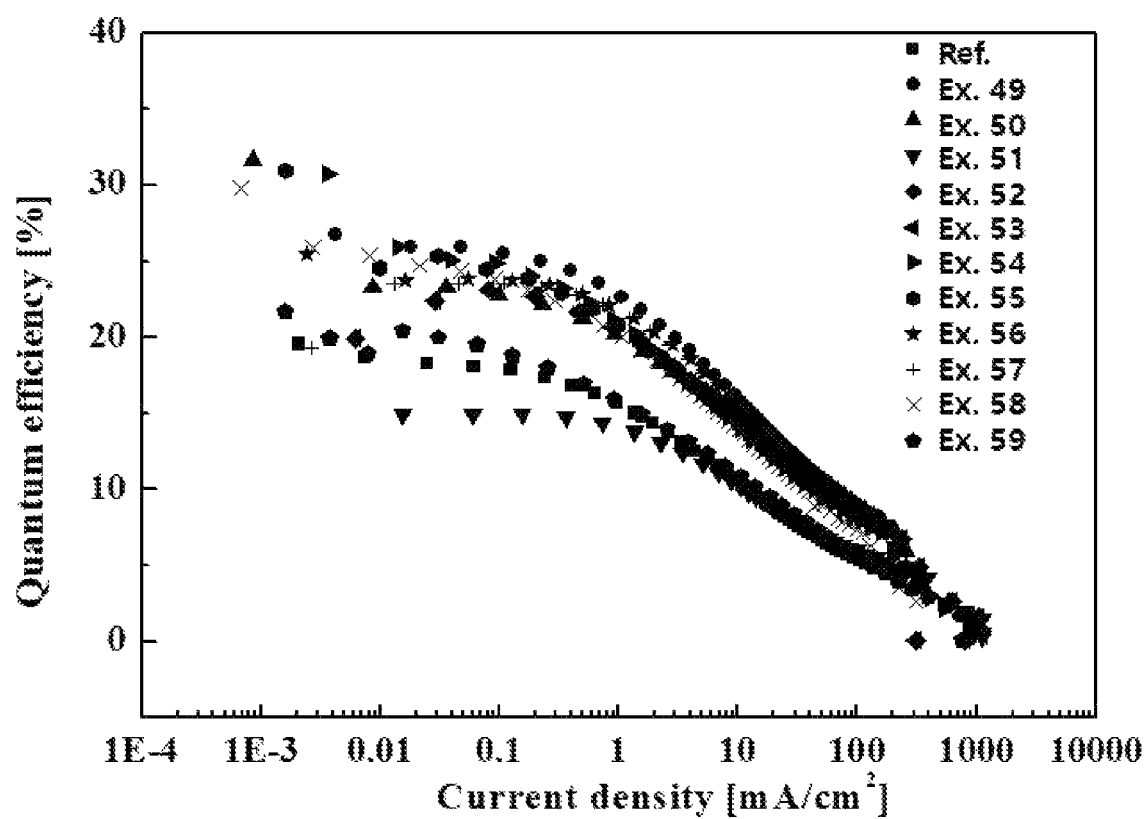
FIG. 11 is a graph illustrating measurement results of current density-EQE (external quantum efficiency) of OLEDs fabricated in accordance with Examples of the present disclosure.
Figure 12:
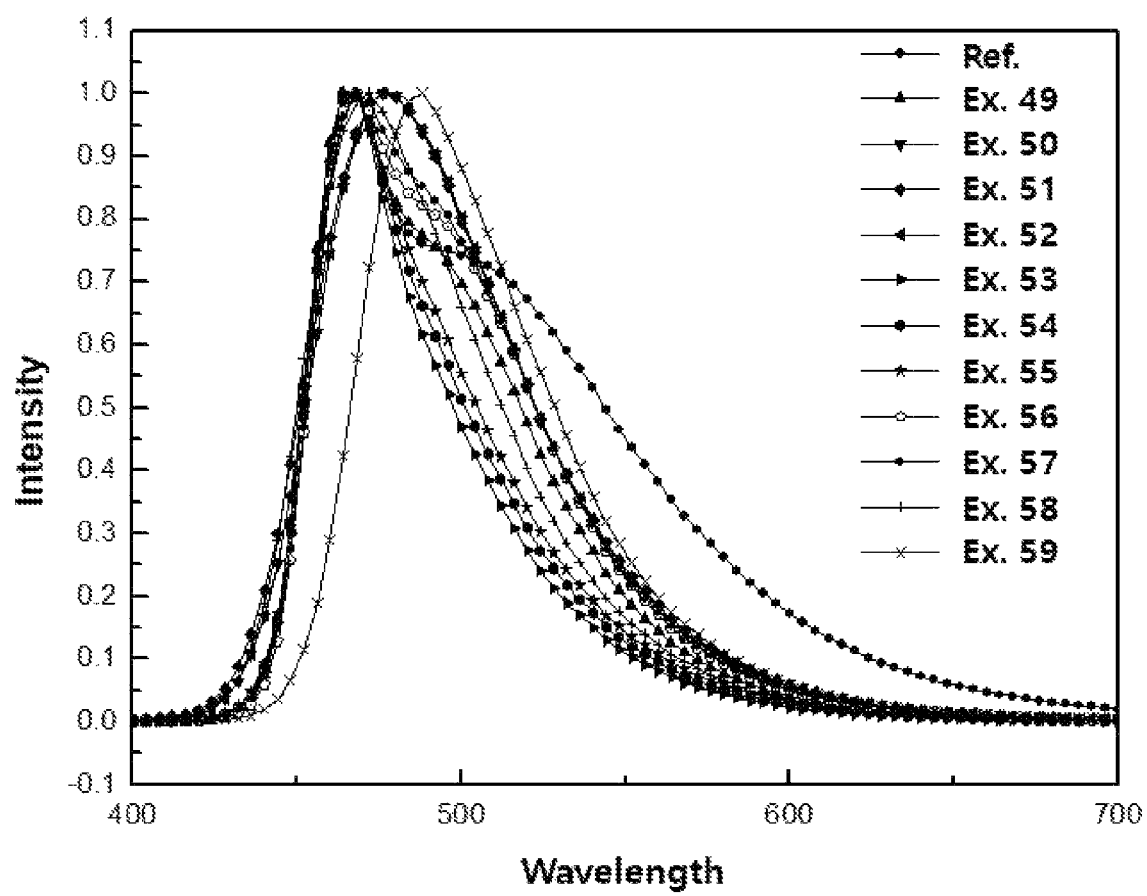
FIG. 12 is a graph illustrating measurement results of EL (electroluminescence) spectra of OLEDs fabricated in accordance with Examples of the present disclosure.

Luminous properties of each of the organic light emitting diode manufactured by Example's 49 to 59 and Comparative Example were measured as the same process as Experimental Example 1. The measurement results are shown in the following Table 5. Also, each of FIGS. 10 to 12 is a graph illustrating measurement results of voltage-current density, current density-EQE and EL (electroluminescence) spectra of the OLEDs.

TABLE 5

Luminous Properties of F/T/A OLED

| Sample | Voltage | lm/w | EQE | CIEx, CIEy |
|---|---|---|---|---|
| Ref. (MADN:2CzPN = 7:3) | 4.4 | 16.5 | 9.9 | 0.222, 0.357 |
| Ex. 49 (H1:T1) | 4.3 | 20.1 | 15.1 | 0.157, 0.276 |
| Ex. 50 (H1:T2) | 4.3 | 19.5 | 15.0 | 0.163, 0.296 |
| Ex. 51 (H1:T3) | 3.9 | 14.6 | 10.5 | 0.166, 0.290 |
| Ex. 52 (H1:T5) | 4.0 | 20.3 | 14.4 | 0.164, 0.297 |
| Ex. 53 (H1:T6) | 4.6 | 13.4 | 13.7 | 0.147, 0.211 |
| Ex. 54 (H1:T7) | 4.3 | 15.3 | 14.1 | 0.149, 0.226 |
| Ex. 55 (H2:T1) | 4.1 | 16.6 | 14.3 | 0.152, 0.238 |
| Ex. 56 (H2:T2) | 4.0 | 22.0 | 15.5 | 0.161, 0.301 |
| Ex. 57 (H2:T3) | 4.1 | 21.2 | 15.0 | 0.162, 0.300 |
| Ex. 58 (H2:T5) | 4.6 | 8.8 | 13.9 | 0.139, 0.116 |
| Ex. 59 (H2:T6) | 4.3 | 12.4 | 11.0 | 0.152, 0.245 |

As indicated in Table 5, compared to the OLED including the single-layered EML in the Comparative Example, the F/T/A OLED in Examples 49 to 59 lowered its driving voltage up to 11.4%, improved its power efficiency up to 33.3% and its EQE up to 56.6% and implemented blue light emission having much higher color purity.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An organic light emitting diode, comprising:
a first electrode and a second electrode facing each other; and
at least one emitting unit disposed between the first electrode and the second electrode, the at least one emitting unit including an emitting material layer,
wherein the emitting material layer includes a first emitting material layer including a first compound and a second compound, and a second emitting material layer including a third compound and fourth compound and disposed between the first electrode and the first emitting material layer or disposed between the first emitting material layer and the second electrode,
wherein each of the first compound and the third compound includes independently an organic compound having a following structure of Chemical Formula 1, the second compound includes an organic compound having a following structure of Chemical Formula 3:

Chemical Formula 1

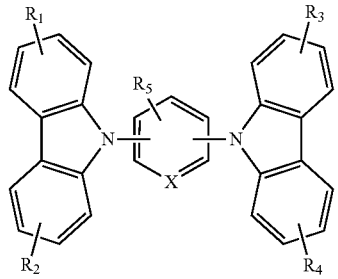

wherein each of $R_1$ to $R_5$ is independently selected from the group consisting of protium, deuterium, tritium, $C_5$~$C_{30}$ aryl group and $C_4$~$C_{30}$ hetero aryl group, and X is $CR_6$ or nitrogen (N), wherein $R_6$ is protium, deuterium, tritium or $C_1$~$C_{20}$ alkyl group, Chemical Formula 3

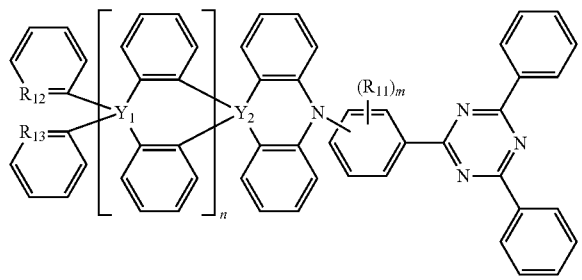

wherein $R_{11}$ is selected from the group consisting of protium, deuterium, tritium, $C_5$~$C_{30}$ aryl group and $C_4$~$C_{30}$ hetero aryl group, each of $R_{12}$ and $R_{13}$ is a carbon (C), wherein each of $R_{12}$ and $R_{13}$ is bonded to protium, deuterium or tritium or $R_{12}$ is bonded to $R_{13}$ directly or through oxygen (O), sulfur (S) or selenium (Se), each of $Y_1$ and $Y_2$ is independently carbon (C), silicon (Si) or germanium (Ge), m is an integer of 1 to 4, and n is an integer of 1 to 2, and wherein the fourth compound is 5,6-bis[4-(10-phenyl-9-anthryl)phenyl]-2,2'-bipyridine (PAP2BPy), 5,6-bis[4'-(10-phenyl-9-anthryl)biphenyl-4-yl]-2,2'-bipyridine (PAPP2BPy), N,N'-bis[4-(9-phenyl-9H-fluoren-9-yl)phenyl]-N,N'-diphenyl-pyrene-1,6-diamine (1,6-FLPAPrn), N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), N,9-diphenyl-N-[4-(10-phenyl-9-anthryl)phenyl]-9H-carbazol-3-amine (PCAPA), 2,5,8,11-tetra-tert-butylperylene (TBP), 4-(10-phenyl-9-anthryl)-4'-(9-phenyl-9H-carbazol-3-yl)triphenylamine (PCBAPA), N,9-diphenyl-N-[4-(9,10-diphenyl-2-anthryl)phenyl]-9H-carbazol-3-amine (2PCAPPA), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), 9-triphenylanthracen-9-amine (DPhAPhA), N, N,N'-diphenylquinacridone (DPQd), 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyl)acenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB), or N,N,N',N'-Tetraphenyl-pyrene-1,6-diamine.

2. The organic light emitting diode of claim 1, wherein the second emitting material layer further comprises a fifth compound, and wherein the fifth compound includes the organic compound having the structure of Chemical Formula 3.

3. The organic light emitting diode of claim 1, wherein the second emitting material layer is disposed between the first electrode and the first emitting material layer, and the emitting unit further comprises an electron blocking layer disposed between the first electrode and the second emitting material layer.

4. The organic light emitting diode of claim 3, wherein the third compound is the same as a material of the electron blocking layer.

5. The organic light emitting diode of claim 1, wherein the second emitting material layer is disposed between the first emitting material layer and the second electrode, and the emitting unit further comprise a hole blocking layer disposed between the second electrode and the second emitting material layer.

6. The organic light emitting diode of claim 5, wherein the third compound is the same as a material of the hole blocking layer.

7. The organic light emitting diode of claim 1, wherein the emitting material layer further comprises a third emitting material layer disposed opposite to the second emitting material layer with respect to the first emitting material layer.

8. The organic light emitting diode of claim 7, wherein the third emitting material layer includes a sixth compound, a seventh compound, and an eighth compound, wherein the sixth compound includes the organic compound having the structure of Chemical Formula 1, the seventh compound includes the organic compound having the structure of Chemical Formula 3, and the eighth compound is 5,6-bis[4-(10-phenyl-9-anthryl)phenyl]-2,2'-bipyridine (PAP2BPy), 5,6-bis[4'-(10-phenyl-9-anthryl)biphenyl-4-yl]-2,2'-bipyridine (PAPP2BPy), N,N'-bis[4-(9-phenyl-9H-fluoren-9-yl)phenyl]-N,N'-diphenyl-pyrene-1,6-diamine (1,6-FLPAPrn), N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), N,9-diphenyl-N-[4-(10-phenyl-9-anthryl)phenyl]-9H-carbazol-3-amine (PCAPA), 2,5,8,11-tetra-tert-butylperylene (TBP), 4-(10-phenyl-9-anthryl)-4'-(9-phenyl-9H-carbazol-3-yl)triphenylamine (PCBAPA), N,9-diphenyl-N-[4-(9,10-diphenyl-2-anthryl)phenyl]-9H-carbazol-3-amine (2PCAPPA), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), 9-triphenylanthracen-9-amine (DPhAPhA), N, N,N'-diphenylquinacridone (DPQd), 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyl)acenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB) or N,N,N',N'-Tetraphenyl-pyrene-1,6-diamine.

9. The organic light emitting diode of claim 7, wherein the second emitting material layer is disposed between the first electrode and the first emitting material layer, and the emitting unit further comprises an electron blocking layer disposed between the first electrode and the second emitting material layer.

10. The organic light emitting diode of claim 9, wherein the third compound is the same as a material of the electron blocking layer.

11. The organic light emitting diode of claim 7, wherein the second emitting material layer is disposed between the second electrode and the first emitting material layer, and the emitting unit further comprises a hole blocking layer disposed between the second electrode and the second emitting material layer.

12. The organic light emitting diode of claim 11, wherein the third compound is the same as a material of the hole blocking layer.

13. The organic light emitting diode of claim 1, wherein the first compound includes any organic compound having the following structure of Chemical Formula 2

Chemical Formula 2

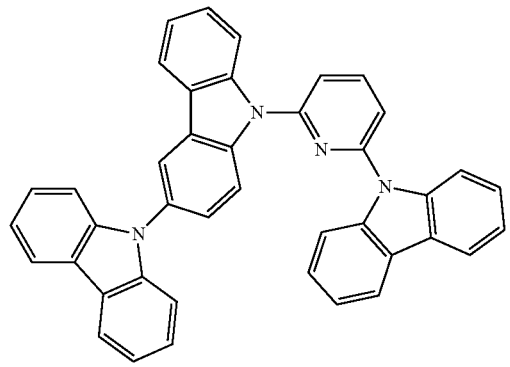
H1

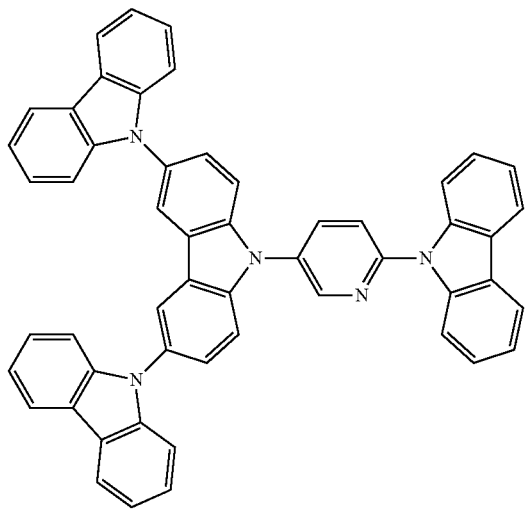
H4

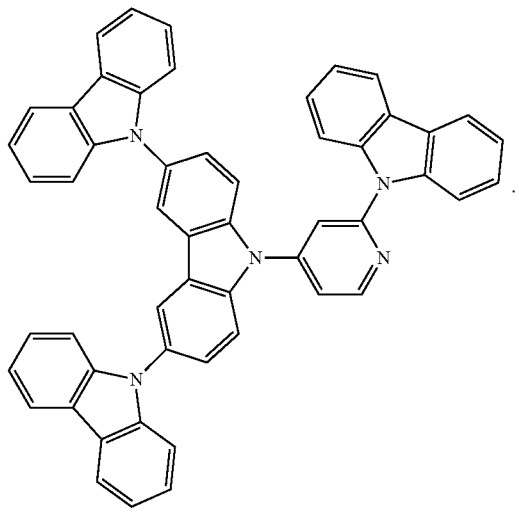
H5

H2

H3

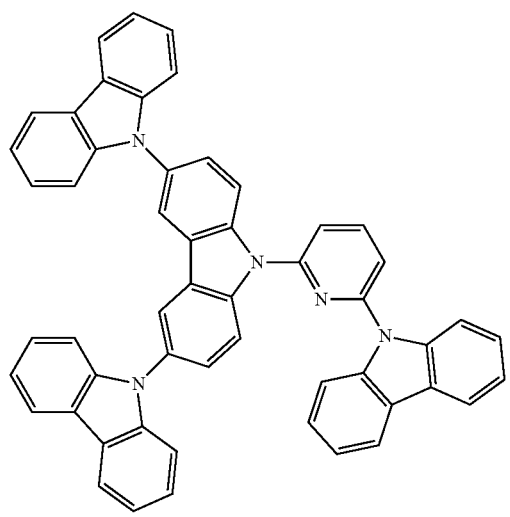

14. The organic light emitting diode of claim 1, wherein the second compound includes any one organic compound having the following structure of Chemical Formulae 4:

Chemical Formula 4

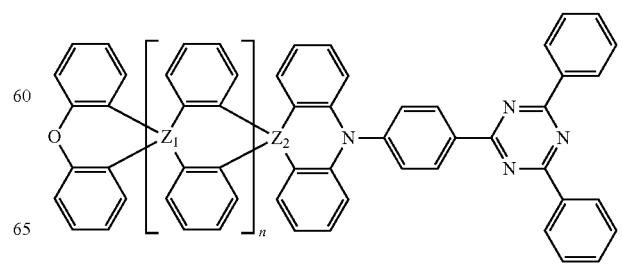

-continued

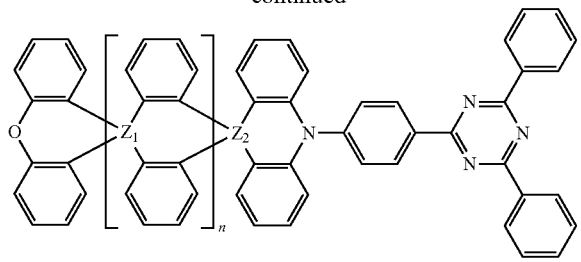

wherein each of $Z_1$ and $Z_2$ is independently carbon or silicon, n is identical as defined in Chemical Formula 3.

15. The organic light emitting diode of claim 1, wherein the second compound includes any one organic compound having the following structure of Chemical Formula 7:

Chemical Formula 7

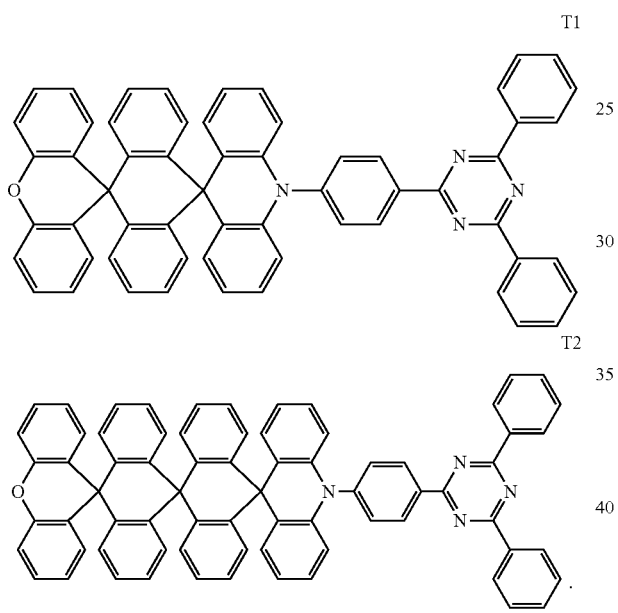

16. The organic light emitting diode of claim 1, wherein the first compound and the second compound is mixed with a weight ratio between about 99:1 and about 70:30 in the first emitting material layer.

17. The organic light emitting diode of claim 1, wherein the at least one emitting unit includes a first emitting unit disposed between the first electrode and the second electrode and including a lower emitting material layer, and a second emitting unit disposed between the first emitting unit and the second electrode and including an upper emitting material layer,
wherein at least one of the lower emitting material layer and the upper emitting material layer includes the first emitting material layer and the second emitting material layer, and
further comprising a charge generation layer disposed between the first emitting unit and the second emitting unit.

18. The organic light emitting diode of claim 17, wherein the at least one of the lower emitting material layer and the upper emitting material layer further comprises a third emitting material layer disposed opposite to the second emitting material layer with respect to the first emitting material layer.

19. An organic light emitting device, comprising:
a substrate; and
an organic light emitting diode according to claim 1 over the substrate.

20. The organic light emitting device of claim 19, wherein the organic light emitting device includes an organic light emitting display device or an organic light emitting illumination device.

21. An organic light emitting diode, comprising:
a first electrode and a second electrode facing each other;
at least one emitting unit disposed between the first electrode and the second electrode, the at least one emitting unit including an emitting material layer,
wherein the emitting material layer includes a first emitting material layer including a first compound and a second compound, and a second emitting material layer including a third compound and fourth compound and disposed between the first electrode and the first emitting material layer or disposed between the first emitting material layer and the second electrode,
wherein the first compound includes an organic compound having a following structure of Chemical Formula 1, the second compound includes an organic compound having a following structure of Chemical Formula 3:

Chemical Formula 1

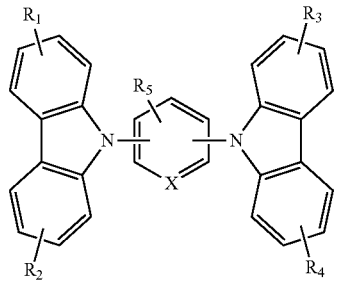

wherein each of $R_1$ to $R_5$ is independently selected from the group consisting of protium, deuterium, tritium, $C_5$~$C_{30}$ aryl group and $C_4$~$C_{30}$ hetero aryl group, and X is $CR_6$ or nitrogen (N), wherein $R_6$ is protium, deuterium, tritium or $C_1$~$C_{20}$ alkyl group, Chemical Formula 3

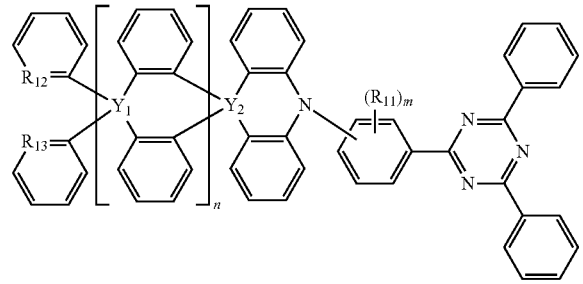

and wherein $R_{11}$ is selected from the group consisting of protium, deuterium, tritium, $C_5$~$C_{30}$ aryl group and $C_4$~$C_{30}$ hetero aryl group, each of $R_{12}$ and $R_{13}$ is a carbon (C), wherein each of $R_{12}$ and $R_{13}$ is bonded to protium, deuterium or tritium or $R_{12}$ is bonded to $R_{13}$ directly or through oxygen (O), sulfur (S) or selenium (Se), $Y_1$ is carbon (C), silicon (Si) or germanium (Ge), $Y_2$ is carbon (C) or germanium (Ge), m is an integer of 1 to 4, and n is an integer of 1 to 2.

22. The organic light emitting diode of claim 21, wherein each of the first emitting material layer and the second emitting material layer are for blue light emission, and wherein the fourth compound of the second emitting material layer is different from the second compound of the first emitting material layer.

23. The organic light emitting diode of claim 21, wherein the third compound includes the organic compound having the structure of Chemical Formula 1.

24. The organic light emitting diode of claim 21, wherein the fourth compound is an anthracene-based compound, a tetracene-based compound, a chrysene-based compound, a phenanthrene-based compound, a pyrene-based compound, a perylene-based compound, a stilbene-based compound, an acridone-based compound, a coumarin-based compound, a phenoxazine-based compound or a phenothiazine-based compound.

25. The organic light emitting diode of claim 21, wherein the second emitting material layer further comprises a fifth compound, and wherein the fifth compound includes the organic compound having the structure of Chemical Formula 3.

26. The organic light emitting diode of claim 21, wherein the emitting material layer further comprises a third emitting material layer disposed opposite to the second emitting material layer with respect to the first emitting material layer.

27. The organic light emitting diode of claim 26, wherein the third emitting material layer includes a sixth compound, a seventh compound, and an eighth compound, wherein the sixth compound includes the organic compound having the structure of Chemical Formula 1, the seventh compound includes the organic compound having the structure of Chemical Formula 3, and the eighth compound is an anthracene-based compound, a tetracene-based compound, a chrysene-based compound, a phenanthrene-based compound, a pyrene-based compound, a perylene-based compound, a stilbene-based compound, an acridone-based compound, a coumarin-based compound, a phenoxazine-based compound or a phenothiazine-based compound.

* * * * *